(12) United States Patent
Takegoshi et al.

(10) Patent No.: US 9,335,389 B2
(45) Date of Patent: May 10, 2016

(54) NMR DETECTION PROBE

(71) Applicants: Kyoto University, Kyoto-shi, Kyoto (JP); JEOL Resonance Inc., Tokyo (JP)

(72) Inventors: Kiyonori Takegoshi, Kyoto (JP); Takashi Mizuno, Tokyo (JP)

(73) Assignees: Kyoto University, Kyoto-shi, Kyoto (JP); JEOL Resonance Inc., Tokyo (JP)

( * ) Notice: Subject to any disclaimer, the term of this patent is extended or adjusted under 35 U.S.C. 154(b) by 511 days.

(21) Appl. No.: 13/971,957

(22) Filed: Aug. 21, 2013

(65) Prior Publication Data
US 2014/0055139 A1 Feb. 27, 2014

(30) Foreign Application Priority Data
Aug. 23, 2012 (JP) ................. 2012-184541

(51) Int. Cl.
*G01V 3/00* (2006.01)
*G01R 33/34* (2006.01)
*G01R 33/30* (2006.01)
*G01R 33/31* (2006.01)

(52) U.S. Cl.
CPC ............... *G01R 33/34* (2013.01); *G01R 33/30* (2013.01); *G01R 33/3403* (2013.01); *G01R 33/307* (2013.01); *G01R 33/31* (2013.01)

(58) Field of Classification Search
USPC ......................................... 324/322
See application file for complete search history.

(56) References Cited

U.S. PATENT DOCUMENTS

| | | | | |
|---|---|---|---|---|
| 5,508,613 A * | 4/1996 | Kotsubo | ............... | F25D 19/006 324/315 |
| 6,838,880 B2 * | 1/2005 | Hofmann | ............. | G01R 33/307 324/318 |
| 7,282,919 B2 * | 10/2007 | Doty | .................... | G01R 33/307 324/321 |
| 7,288,939 B1 * | 10/2007 | Barbara | ................ | G01R 33/31 324/318 |
| 7,482,808 B2 * | 1/2009 | Koga | ................ | G01R 33/3815 324/318 |
| 7,501,822 B2 * | 3/2009 | Sacher | ............ | G01R 33/34015 324/318 |
| 2005/0122107 A1 * | 6/2005 | Hasegawa | .............. | G01R 33/30 324/318 |
| 2007/0096740 A1 * | 5/2007 | Fukuda | .................. | G01R 33/30 324/321 |
| 2007/0257673 A1 * | 11/2007 | Nakahara | ............... | G01R 33/31 324/315 |
| 2007/0257675 A1 * | 11/2007 | Marek | ............. | G01R 33/34046 324/318 |
| 2009/0183860 A1 * | 7/2009 | Krencker | .............. | F28D 7/0066 165/164 |
| 2010/0321018 A1 * | 12/2010 | Takegoshi | .......... | G01R 33/3403 324/318 |
| 2013/0009645 A1 * | 1/2013 | Miki | .................... | G01R 33/307 324/322 |
| 2014/0055138 A1 * | 2/2014 | Takegoshi | .......... | G01R 33/3403 324/322 |
| 2015/0332829 A1 * | 11/2015 | Stautner | ................... | H01F 6/04 505/162 |

FOREIGN PATENT DOCUMENTS

| | | |
|---|---|---|
| JP | 5899655 U | 7/1983 |
| JP | 6070083 U | 5/1985 |
| JP | 2004233337 A | 8/2004 |
| JP | 2008241493 A | 10/2008 |

* cited by examiner

*Primary Examiner* — Rodney Fuller
(74) *Attorney, Agent, or Firm* — The Webb Law Firm

(57) ABSTRACT

A cooled NMR detection probe including a detection coil and an internal structure (65) mounted in a vacuum vessel (58) includes a radiation shield assembly (68), a connecting member (74), and a heat exchanger (80). The internal structure (65) is secured to the vacuum vessel (58) by a holding member (66). If the internal structure shrinks during cooling, the position of an upper portion of the first heat exchanger (80) hardly varies, thus suppressing displacement of a core module (54).

9 Claims, 21 Drawing Sheets

NMR DETECTION PROBE

BACKGROUND OF THE INVENTION

1. Field of the Invention

The present invention relates to an NMR probe operative to detect nuclear magnetic resonance (NMR) signals and, more particularly, to a cooled NMR detection probe structure for detecting NMR signals.

2. Description of Related Art (1) Fundamental Configuration of NMR Instrument An NMR instrument is an apparatus for analyzing the molecular structure of a sample under investigation by placing it in a static magnetic field, applying an RF signal to the sample, then detecting a feeble RF signal (NMR signal) emanating from the sample, and extracting molecular structure information contained in the detected signal.

The positional relationship between a conventional NMR probe and a superconducting magnet producing a static magnetic field is shown in FIG. 20. The superconducting magnet, indicated by A, has windings of superconducting wire therein to form a main wound coil B. The main coil B is normally placed in an adiabatic vessel (not shown) capable of storing liquid helium or the like, and is cryogenically cooled. The NMR probe, indicated by C, is configured including a jawlike base portion 400 disposed outside the magnet and a tubular portion 410 inserted inside the magnet. The tubular portion 410 is provided within a cylindrical through-hole D extending along the central axis of the superconducting magnet A. Usually, the cylindrical portion 410 is inserted upward into the hole D from the opening located below the hole D.

FIG. 21 schematically shows the configuration of the NMR instrument. This instrument has an RF oscillator 501 generating an RF signal which is controlled in phase and amplitude by a phase controller 502 and an amplitude controller 503. The signal is fed to a power amplifier 504, where the RF signal is amplified to a power necessary to excite an NMR signal. The RF signal is then fed to an NMR probe 506 via a duplexer 505. The signal is then applied to the sample under investigation from a detection coil (not shown) placed in the NMR probe 506.

After the RF irradiation, a feeble NMR signal generated from the sample under investigation is detected by the detection coil (not shown) placed in the NMR probe 506 and again passed through the duplexer 505. The signal is then fed to a preamplifier 507, where the signal is amplified to a signal intensity permitting reception.

A receiver 508 converts the RF NMR signal amplified by the preamplifier 507 to an audio frequency that can be converted into digital form. At the same time, the receiver controls the amplitude. The audio-frequency NMR signal from the receiver 508 is converted into digital form by an analog-to-digital data converter 509 and sent to a control computer 510. The control computer 510 controls the phase controller 502 and the amplitude controller 503 and Fourier-transforms the NMR signal accepted in the time domain. The computer automatically corrects the phase of the Fourier-transformed NMR signal and displays the signal as an NMR spectrum.

(2) General Explanation of the Prior Art

A cooled NMR detection probe (known as a cryoprobe) is known as one type of NMR probe. This probe utilizes a vacuum vessel such that various parts (especially, components of a detection system) in the vacuum vessel are placed in a cryogenetic state. The especially important part of the cooled components is the detection module (hereinafter may be referred to as the core module) for detecting NMR signals. For example, a conventional core module is composed of a bobbin and a coil wound around the outer surface of the bobbin. A heat exchanger is disposed in the vacuum vessel to cool the detection system. If the sample under investigation is a solid, the sample tube holding the solid sample therein is rotatably arranged in a posture tilted at a given angle (so-called the magic angle) within the cylindrical partition wall of the vacuum vessel. During investigation of the sample, the sample tube is spun at high speed. At this time, the sample itself is placed at room temperature. On the other hand, the detection system (especially, the core module) in the vacuum vessel is placed at a cryogenic temperature as described previously. Measurements may be performed at arbitrary sample temperatures. Cooled components existing in the vacuum vessel include the aforementioned core module, elements constituting the detection circuit (variable capacitor, fixed capacitor, and so on), a duplexer for switching the signal between outgoing signal and receiving signal, a preamplifier, a directional coupler, a coaxial cable, and a radiation shield.

(3) Sensitivity of NMR Probe

NMR signals observed using an NMR probe have frequencies lying in the range from several MHz to hundreds of MHz. In this frequency range, principal noise is Johnson noise (thermal noise) caused by fluctuations of phonons within a conductor constituting the signal detection circuit. The intensity of such thermal noise (in voltage) is constant irrespective of the frequency (carrier frequency) of the sent signal. Thus, so-called white noise is generated. Other noises include flicker noise which can be neglected at radio frequencies. In order to improve the sensitivity by reducing thermal noise, it is desired to cool the detection system. The cooled NMR detection probe has been developed under this concept, and achieves high detection sensitivity.

In NMR spectral measurements, signal-to-noise ratio (S/N) is generally given by the following equation:

$$\frac{V_S}{V_N} = M_0 \sin\theta_m \sqrt{\frac{Q_c \mu_0 \eta_f v_s \omega_0}{4 k_B (T_c + T_a) \Delta f}} \quad (1)$$

Note that dielectric coupling is neglected.

The parameters in the above equation have the following meanings. $V_S$ is an electromotive force (in voltage) inducing an NMR signal attributed to nuclear spins. $V_N$ is the sum of electromotive forces (in voltage) produced by noises generated from the transmit/receive coil to the preamplifier output. $M_0$ indicates thermally balanced magnetization of nuclear spins in a static magnetic field. $\theta_m$ is an angle made between the oscillating magnetic field produced by the transmit/receive coil and the static magnetic field. In the case of NMR spectroscopy for a solid sample, this angle is the magic angle. In particular, this angle satisfies the relationship:

$$\cos\theta_m = 1/\sqrt{3} \text{ (roughly } 54.7°\text{)}$$

$\mu_0$ is the vacuum permeability. $v_s$ is the volume of the sample. $\omega_0$ is the Larmor frequency of nuclear spins in the static magnetic field. $k_B$ is the Boltzmann constant. $\Delta f$ is the observation bandwidth. $Q_c$ is the Q's value of the transmit/receive coil. $\eta_f$ is the filling factor, which is, in principle, the ratio between the magnetic field strength in the sample space and the whole magnetic field strength felt by the transmit/receive coil. Where the transmit/receive coil is a solenoid coil, the filling factor can be simply represented as the ratio of the sample volume to the cylindrical volume inside the coil. $T_c$ is the temperature of the conductor constituting the transmit/receive coil. $T_a$ is the temperature (noise temperature) of the preamplifier.

The cooled NMR detection probe reduces the thermal noise (depending on $T_c$) arising from the conductor forming the transmit/receive coil by placing the sample at room temperature or at a given temperature, spinning the sample at high speed, and placing the detector coil (acting also as an RF pulse transmitter coil; transmit/receive coil in this meaning) at a cryogenic temperature (e.g., below 20 K). Also, the Q value ($Q_c$) of the transmit/receive coil is improved by lowering the resistance (depending on $T_c$) of the conductor forming the transmit/receive coil, i.e., by lowering the RF resistance.

However, in the cooled NMR detection probe, it is necessary to form a cylindrical partition wall to create a vacuum insulating layer between the transmit/receive coil and the sample tube. Therefore, the inside diameter of the transmit/receive coil is inevitably greater than that of an ordinary NMR probe. This makes the filling factor smaller than that of an ordinary NMR probe (see FIG. 3 that will be referenced later). To address this problem, it is desired that the inside diameter of the transmit/receive coil be reduced to increase the filling factor. If the wall thickness of the bobbin around which the transmit/receive coil is wound is reduced for that purpose, then it will be impossible to sufficiently cool the transmit/receive coil via the bobbin (i.e., $T_c$ will vary). In this way, restrictions are imposed on thinning of the bobbin wall. That is, there is a restriction on reduction of the inside diameter of the transmit/receive coil.

(4) Detailed Explanation of the Prior Art

Referring to FIGS. 1-4, there is shown a cooled NMR detection probe (herein referred to as the comparative example). This probe is to be compared with an embodiment described later (see JP-A-2008-241493). This probe has an insertion portion 14 that is inserted into a bore 12 formed in a magnetic field generator 10. The insertion portion 14 is composed of a probe head 16 and a probe body 18. A vacuum vessel 20 forms a partition wall. A sleeve 24 acting as a cylindrical partition wall is formed in an upper part of the vacuum vessel 20. The sleeve 24 has an internal passage in which a sample tube 26 is rotatably inserted. The sample tube 26 is disposed in a posture tilted at a given angle.

A rotating mechanism 28 gives a rotating force to the opposite ends of the sample tube 26 while holding them. The inner passage of the sleeve 24 is at atmospheric pressure and room temperature. The inside 22 of the vessel 20 is in a vacuum state. The parts placed in the vessel 20 are at low temperatures. A core module 30 forming a main part of the detection system is disposed in the probe head 16. In this example, the core module 30 includes a transmit/receive coil 34 and a bobbin 32 shaped like a silk hat and having a cylindrical portion 32A. The transmit/receive coil 34 is solenoidal in shape and formed on the outer surface of the cylindrical portion 32A of the bobbin 32. The coil 34 applies an RF magnetic field to the sample to induce a nuclear magnetic resonance, which is detected as a signal by the coil 34. The bobbin 32 has a jawlike portion (circular fringes) 32B to which an upper-end portion of a flexible heat link 38 is coupled. The bobbin 32 is made, for example, of sapphire. In the illustrated example, the bobbin 32 is fixed to the vacuum vessel 20 via a plurality of jigs (not shown) made of a heat insulating material such as FRP (fiber-reinforced plastic). The lower end of the heat link 38 is coupled to one end of a heat exchanger 36. Liquid helium, for example, is introduced in the heat exchanger 36. As a result, the heat exchanger is placed at a cryogenic temperature (e.g., 4 K) chiefly by latent heat produced by evaporation of helium. The heat exchanger 36 is in thermal communication with the bobbin 32 via the heat link 38. Consequently, the transmit/receive coil 34 is cooled.

FIG. 2 is a perspective view of the core module 30 shown in FIG. 1. The core module 30 includes the bobbin 32 shaped like a silk hat and the transmit/receive coil 34 (not shown in FIG. 2) as described previously. The sleeve 24 forming a part of the vacuum vessel is disposed in the cylindrical portion of the bobbin 32. The sample tube 26 is inserted in the sleeve 24. The flexible heat link 38 consisting of belt-like members 38A and 38B is formed across the surface of the jawlike portion of the bobbin 32 and the heat exchanger 36. The heat link 38 acts as a heat conducting member. The belt-like members 38A and 38B are in loose state. As described in detail later, if the heat exchanger 36 is shifted downward due to contraction during cooling, the distance between the bobbin 32 fixed to the vacuum vessel and the displaced heat exchanger 36 varies. The variation in the distance is absorbed by slackening of the belt-like members. In other words, if the heat exchanger 36 is shifted downward due to contraction, the bobbin 32 is securely fixed to the vacuum vessel to prevent the position of the core module 30 from varying. In FIG. 3, the diameters of the members are denoted. That is, the sample tube 26 has an inside diameter of φ1 and an outside diameter of φ2. The sleeve 24 has an inside diameter of φ3 and an outside diameter of φ4. The cylindrical portion 32A of the bobbin has an inside diameter of φ5 and an outside diameter of φ6. Preferably, the transmit/receive coil is placed as close as possible to the sample but the sleeve 24 and bobbin cylindrical portion 32A exist between them. Therefore, there is a limitation on reducing the distance.

FIG. 4A schematically shows the cooled NMR detection probe under the condition in which the probe is not yet cooled but at room temperature. FIG. 4B schematically shows the cooled NMR detection probe under the condition in which the probe is being cooled. The heat exchanger 36 is mounted in the vacuum vessel 20 and supported by a pillar 37 having a base end securely fixed to a lower unit 43. A cylindrical radiation shield 39 reflects infrared radiation coming from the outside and infrared radiation emitted inwardly from the vacuum vessel 20. A connecting member 41, which is fixedly connected to the pillar 37, holds the radiation shield 39 to the pillar 37. The temperature of the vacuum vessel 20 itself is essentially at room temperature irrespective of whether the probe is in the state of FIG. 4A or in the state of FIG. 4B. On the other hand, the internal structure of the vacuum vessel 20 contracts as indicated by the arrows in FIG. 4B according to the linear expansion coefficients intrinsic to the various members during a transitional process from room temperature to cooled state. The various members are shifted downward toward the lower unit 43. A member located at a higher position experiences a larger amount of displacement. A reference height is indicated by h1. The height of the upper surface of the heat exchanger 36 is indicated by h2. The height of the detection center (sample center) is indicated by h3. Because of contraction of the various members, the height h2 of the upper surface of the heat exchanger 36 has decreased by Δh to a height h4. Concomitantly, the flexible heat sink 38 has elongated as indicated by 38a. Note that the elongation is shown exaggeratedly in FIG. 4B. On the other hand, the bobbin is securely held to the vacuum vessel 20 by the jigs (not shown) and so the height of the transmit/receive coil does not vary before and after the cooling.

(5) Consideration from a Point of View of Filling Factor

The filling factor is defined to be the ratio of the space occupied by the sample under investigation to the space of the RF magnetic field set up by the transmit/receive coil. The filling factor is a dimensionless number and has a positive proportional relationship to the NMR detection sensitivity performance (S/N). To a quite simple approximation, the ratio of the volume of the sample to the volume of the transmit/receive coil can be regarded as the filling factor. In NMR measurements on solid samples, the samples rarely extend beyond the volume of the transmit/receive coil. Assuming that the sample tube has a coaxial configuration, the filling factor can be approximated by the ratio of the outside diameter of the cylindrical sample to the inside diameter of the coil. Accordingly, from a point of view of S/N, the inside diameter of the coil is preferably set closer to the outside diameter of the sample.

In the above-described comparative example (or the conventional example), a solenoidal coil is formed on the outer surface of the cylindrical portion of the bobbin shaped like a silk hat. The inside diameter of the transmit/receive coil of this design is stipulated as follows (see also FIG. 3).

[Inside diameter φ6 of transmit/receive coil]=[outside diameter of sample]+[thickness of sample tube]×2+[clearance of space in which sample spins]×2+[thickness of vacuum partition sleeve]×2+[clearance of vacuum insulating space]×2+[thickness of cylindrical portion of sapphire bobbin]×2   (2)

Optimization of the filling factor is to reduce the dimensions of the various items to bare minimum. However, when the final term, [thickness of cylindrical portion of sapphire bobbin], is noticed, if this thickness is reduced, the cross-sectional area of heat transfer of the bobbin decreases. This yields a result contrary to the requirement that the coil temperature should be made as low as possible.

Generally, an alternating magnetic field produced by an RF electric current is distributed along the surface of a conductor and does not readily penetrate into the interior of the conductor. The current density is also concentrated in the surface of the conductor (referred to as a surface effect). In addition, in the case of a conductor having a shape like a solenoid coil, each line element is affected by the alternating magnetic fields produced by adjacent line elements. As a result, the electric current is concentrated in the inner surface of the conductor (surface on the radially central side) and the current density is enhanced in this region (known as a proximity effect). Accordingly, in the conventional silk hat-shaped bobbin, the resistivity at the innermost surface (surface layer) of the conductor constituting the transmit/receive coil and the characteristics of the surface determine the magnitude of the loss. Where the transmit/receive coil is plated, particulates of a catalyst may be buried at the boundary between the metalized innermost surface of the coil conductor and the metalized basic material (sapphire) of the bobbin to enhance the adhesion between them. In this case, the electrical conductivity would be lower than where a bulk conductor such as oxygen-free copper is used. Also, the surface roughness would be greater. Where such a transmit/receive coil is supplied with an RF signal, the loss produced in this coil tends to be greater than the loss produced in a coil made of ideal bulk oxygen-free copper. This will deteriorate the coil's Q. If the coil temperature is lowered by cooling, the resistivity of the metal decreases but the concentration of the current density toward the interior of the coil is further enhanced. Hence, the circumstance that is disadvantageous from a point of view of the coil's Q is not improved by cooling.

The NMR probe disclosed in JP-UM-A-58-99655 (Japanese Utility Model Application Ser. No. 56-198075) has an insert coil. It is observed that a cylindrical member outwardly surrounds the insert coil. In this structure, the temperature of the insert coil is directly controlled by gas and so the cylindrical member does not function as a heat conducting medium. JP-UM-A-60-70083 (Japanese Utility Model Application Ser. No. 58-162897) sets forth a method of fabricating an NMR solenoid coil. The method consists of forming a coil pattern on a printed circuit board. Then, the solenoid coil is completed by rounding the printed circuit board while placing the coil surface on the inner side. In this structure, too, the printed circuit board does not function as a heat conducting medium.

(6) Consideration to Contraction Caused by Cooling

As shown in FIGS. 4A and 4B, during a transitional process from room-temperature state to cooled state, various members contract and thus are displaced downwardly. In the structure shown in FIGS. 4A and 4B, the height of the fixed end of the pillar 37 forms a reference height surface. Various members including the pillar 37 are displaced toward the reference height surface. Therefore, a member located at a higher position experiences a larger amount of displacement. If the core module 30 were connected only to the heat exchanger 36, the core module 30 would be displaced downwardly in cooled state. As a result, the bobbin would come into contact with the sleeve. This would ruin the adiabatic state of the core module 30. The cooled state of the transmit/receive coil would no longer be maintained. The temperature of the sample container would vary, resulting in the problem of formation of dew and frost. Accordingly, in the above-described comparative example, the bobbin is fixed to the vacuum vessel via the holding member. To secure heat conduction if the distance between the core module 30 and the heat exchanger 36 varies, the flexible heat link 38 made of foil or wire of a soft metal such as copper or silver is formed between the core module and the heat exchanger.

However, the thermal cross section of the heat link is relatively small and thus it is difficult to secure a sufficient amount of heat transfer through the link. For example, in the structure using the heat link 38 shown in FIGS. 4A and 4B, a temperature difference of 10 K is generated between the heat exchanger 36 and the bobbin. This creates the danger that the transmit/receive coil will not be cooled efficiently. The heat link 38 is made of a metal conductor and located close to the transmit/receive coil. Therefore, the characteristics of the transmit/receive coil might be adversely affected by the heat link 38. Although the jigs for holding the bobbin are made of a heat insulating material such as FRP, heat transfer through the jigs between a room-temperature body and a cryogenic body is not negligible. Therefore, use of such jigs should be minimised. Furthermore, from a point of view of thermal conductivity, the number of parts in the heat transfer path is preferably reduced.

The above-stated issues of contraction are also set forth in JP-A-2004-233337. In the structure shown in JP-A-2004-233337, an internal mechanism consisting of a cooler and a detector is disposed in a vacuum vessel. A pillar is mounted below the detector. The internal mechanism is supported from its underside by the pillar. On the other hand, the detector is fixedly mounted to the underside of the top plate of the vacuum vessel via a heat insulating member. Thus, the internal mechanism is supported also from its upper side. The heating insulating member is in the form of a flat plate such as a spacer. The upper surface of the heat insulating member is in intimate contact with the lower surface of the top plate. This lower surface is in intimate contact with the top surface of the detector. Regarding this structure, it can be pointed out that downward displacement of the detector due to contraction can be restricted but some amount of heat may flow in via the heat insulating member. It is intrinsically difficult to apply this structure to a cooled NMR detection probe for use with a solid sample.

In the conventional cooled type NMR detection probe, when the internal structure is secured to the lower unit, during a transitional process from room-temperature state to cooled state, as various members contract, the internal structure is displaced downward and, therefore, it has been urged to secure the core module (especially, the transmit/receive coil) to the vacuum vessel by jigs (securing members). This has presented the following problems.

First, there is the problem that heat flows in between the vacuum vessel at room temperature and the transmit/receive coil at a cryogenic temperature via the jigs. The inflow of heat creates the possibility that the transmit/receive coil cannot be cooled sufficiently.

Secondly, there is the problem that a heat link (heat conducting member) acting as a rigid body cannot be placed between the heat exchanger and the core module because the core module is kept fixed while the heat exchanger is displaced downward. In the conventional technique, flexible heat links have been used. Such heat links cannot provide good heat conduction. As a result, the core module may not be cooled sufficiently.

SUMMARY OF THE INVENTION

The present invention is intended to solve at least one of the foregoing problems. That is, it is an object of the invention to correctly maintain the position of the detection module even if the detection module itself is not secured to a vacuum vessel. It is another object to secure a sufficient amount of heat transfer between the heat exchanger and the detection module. It is a further object of the invention to provide enhanced sensitivity by cooling the detection coil sufficiently.

An NMR detection probe associated with the present invention includes a vacuum vessel inserted in a static magnetic field generator and extending along a central axis, an internal structure mounted in the vacuum vessel and having a detection coil for detecting an NMR signal emanating from a sample and a cooling source for cooling the detection coil, and a holding member for holding the internal structure to the vacuum vessel above a bottom level of the vacuum vessel as viewed along the central axis. The holding member has an elongated member extending along the central axis between the vacuum vessel and the internal structure.

In this structure, the internal structure contained in the vacuum vessel and including at least the detection coil and the cooling source is held to the vacuum vessel via the holding member. Consequently, the height at which the internal structure is supported (i.e., reference height about shrinkage) can be placed above the height of the bottom. Hence, displacement of an upper part of the internal structure can be made substantially zero or made smaller than conventional. If the position at which the internal structure is supported is set higher, the displacement of the upper part of the internal structure, i.e., the displacement of the detection coil, can be made smaller. Where the displacement of the detection coil can be suppressed within a tolerable range by this structure, it is not necessary to hold the core module itself to the vacuum vessel, the core module having the detection coil. Furthermore, the cooling source and the core module can be coupled together by a rigid body having good thermal conductivity. Thus, the detection coil can be cooled sufficiently.

The holding member has the elongated portion extending along the central axis between the vacuum vessel and the internal structure. The elongated portion is a redundant portion formed to minimize inflow of heat into the internal structure from the vacuum vessel. The elongated portion can increase the heat transfer distance (thermal isolation). The elongated portion deforms inward when the elongated portion is displaced horizontally due to contraction of the internal structure. Consequently, the internal structure can be held reliably irrespective of temperature variations. The vacuum vessel can stretch along the central axis. Various parts are disposed inside the vacuum vessel. Usually, a given gap space spreading along the central axis exists inside the vacuum vessel. Generally, this gap space is cylindrical in shape. Preferably, the elongated portion is placed in this gap space.

Although the detected signal is essentially a nuclear magnetic resonance (NMR) signal, the above-described structure can be employed when other signal (such as an electron spin resonance signal) is detected. The cooling source is a heat exchanger disposed in the vacuum vessel or a member equivalent to such a heat exchanger. Preferably, a core module is coupled directly to the cooling source or indirectly to it via a support member. Usually, the detection coil is a transmit/receive coil. The above-described structure can be used where a transmit coil and a receive coil are mounted separately. Usually, the direction of the aforementioned central axis is an up-and-down direction. In other cases, the above-described structure can also be used, in which case the "above" indicates a direction away from the base along the central axis. Preferably, the internal structure includes a radiation shield. Alternatively, the radiation shield may be mounted independently, and the other components including the cooling source may be supported by the holding member. In the above-described structure, the vacuum vessel performs its intrinsic function, i.e., acts as a vacuum partition. Besides, the vacuum vessel acts as an outer structural member bearing the load of the internal structure.

Preferably, the holding member includes an outer end portion secured to the vacuum vessel, an inner end portion that supports the internal structure, and an intermediate portion including the aforementioned elongated portion. The intermediate portion is located between the outer end portion and the inner end portion. The intermediate portion is a thermally important element. Preferably, the shape and material of the holding member are determined such that heat transfer through the intermediate portion is reduced to a minimum. Also, the intermediate portion is a mechanically important element. That is, when cooling is done and the internal structure is displaced horizontally, the lower end of the elongated portion follows the displacement and moves inward. Preferably, the holding member is made of a material that permits such deformation and can firmly support the internal structure. Especially preferably, the intermediate portion or the elongated portion is made up of plural links which are spaced apart from each other horizontally. With this structure, the cross-sectional area of thermal conduction is reduced and thus inflow of heat can be further suppressed.

Preferably, the internal structure has a radiation shield which extends along the inner surface of the vacuum vessel in an up-and-down direction and blocks infrared radiation. The inner end portion holds the radiation shield, which in turn supports the cooling source. In this structure, the radiation shield acts to diffuse heat and also to increase the heat conduction distance to the cooling source.

Preferably, a connecting member made of a heat insulating material is mounted at an intermediate position of the radiation shield that is lower than the position at which the outer end portion is supported. The cooling source is supported by the radiation shield via the connecting member. In this structure, the holding member, the radiation shield, the connecting member, and other parts are present from the vacuum vessel to the cooling source. These components form a heat transfer path. Therefore, the heat transfer distance on the radiation shield can be increased because the connecting member is mounted in an intermediate position. Furthermore, heat transfer can be suppressed further because the connecting member is formed from a heat insulating material.

Preferably, the internal structure depends from and is secured to the vacuum vessel via the holding member. Preferably, there is provided restriction means for restricting a lower part of horizontal motion of the internal structure. Preferably, the restriction means includes a first member extending downward from the cooling source and a second member that restricts horizontal motion of the first member while permitting sliding motion of the first member along the central axis. The second member engages with the first member. In this structure, when an upper part of the internal structure is held, it is possible to prevent a lower part of the internal structure from swinging.

Preferably, the detection module having the detection coil is held to the cooling source via a hard heat conductor. The detection module is isolated from the vacuum vessel via a vacuum insulating layer. In this structure, good heat conductivity is achieved between the detection module and the cooling source. Furthermore, direct inflow of heat into the detection module can be prevented. Consequently, the detection module and thus the detection coil can be cooled efficiently. Its sensitivity characteristics can be enhanced.

According to the present invention, the position of the detection module can be appropriately maintained even if the detection module is not held in its installation location to the vacuum vessel. Alternatively, sufficient heat transfer can be provided between the heat exchanger and the detection module. Still alternatively, the sensitivity can be enhanced by cooling the detection coil sufficiently.

DESCRIPTION OF THE INVENTION

The preferred embodiments of the present invention are hereinafter described with reference to the drawings.

(1) Cooled NMR Detection Probe

Figure 1:
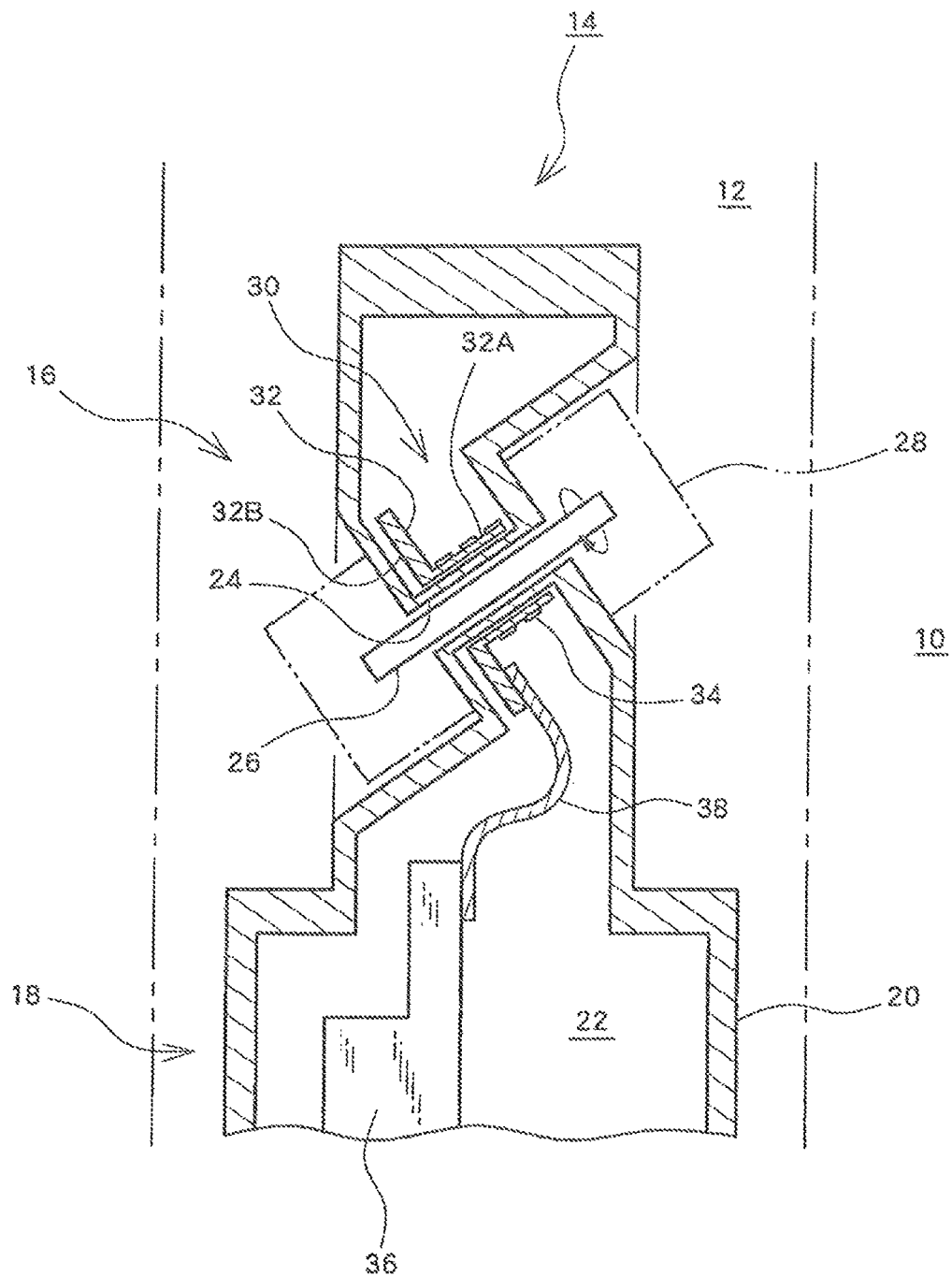
FIG. 1 is a cross-sectional view of a comparative example of a cooled NMR detection probe.
Figure 2:
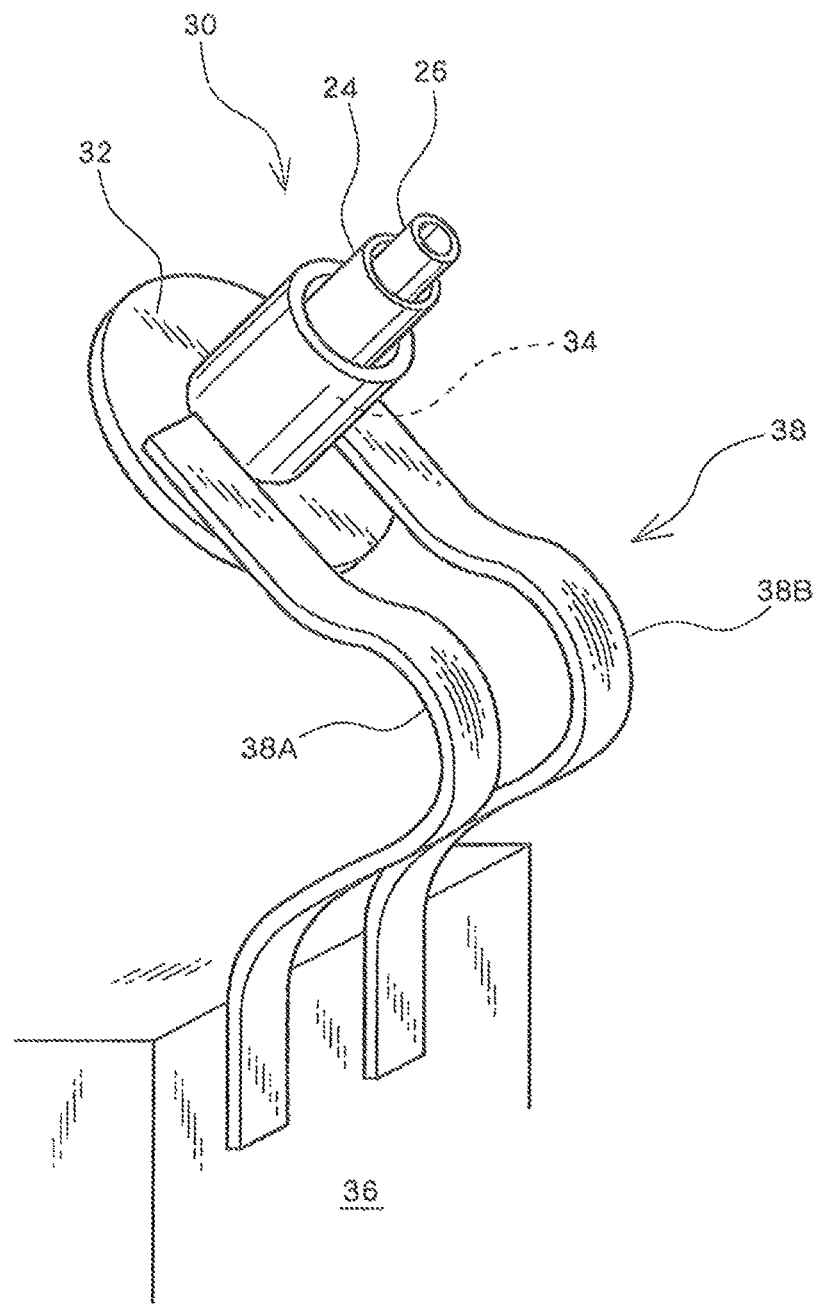
FIG. 2 is a perspective view of a core module included in the NMR detection probe shown in FIG. 1.
Figure 3:
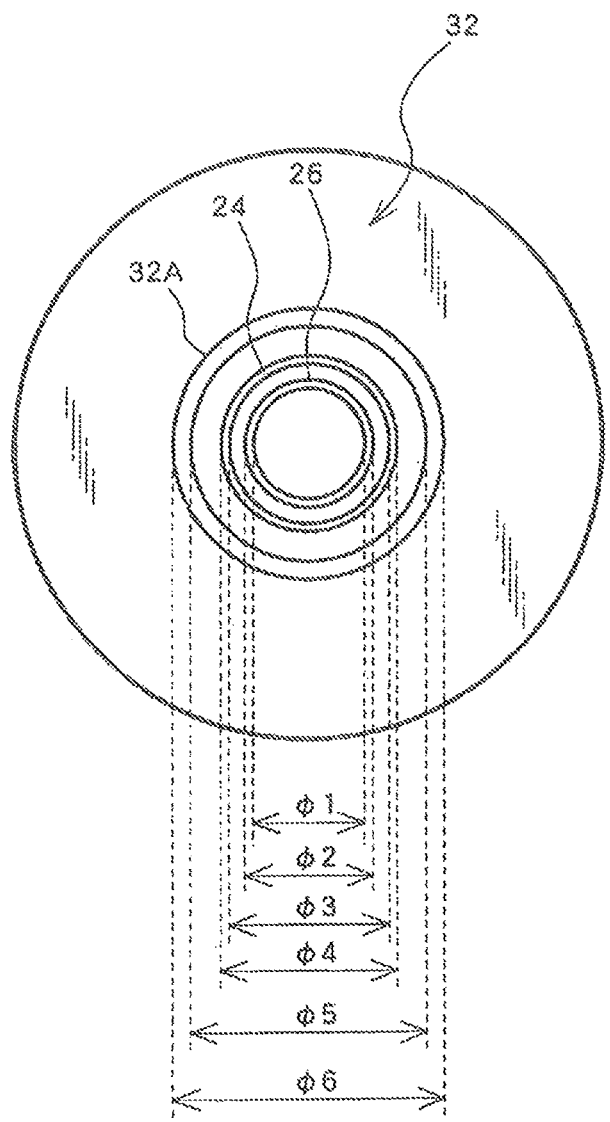
FIG. 3 is a plan view of the core module shown in FIG. 2, illustrating the diameters of members arranged coaxially.
Figures 4A, 4B:
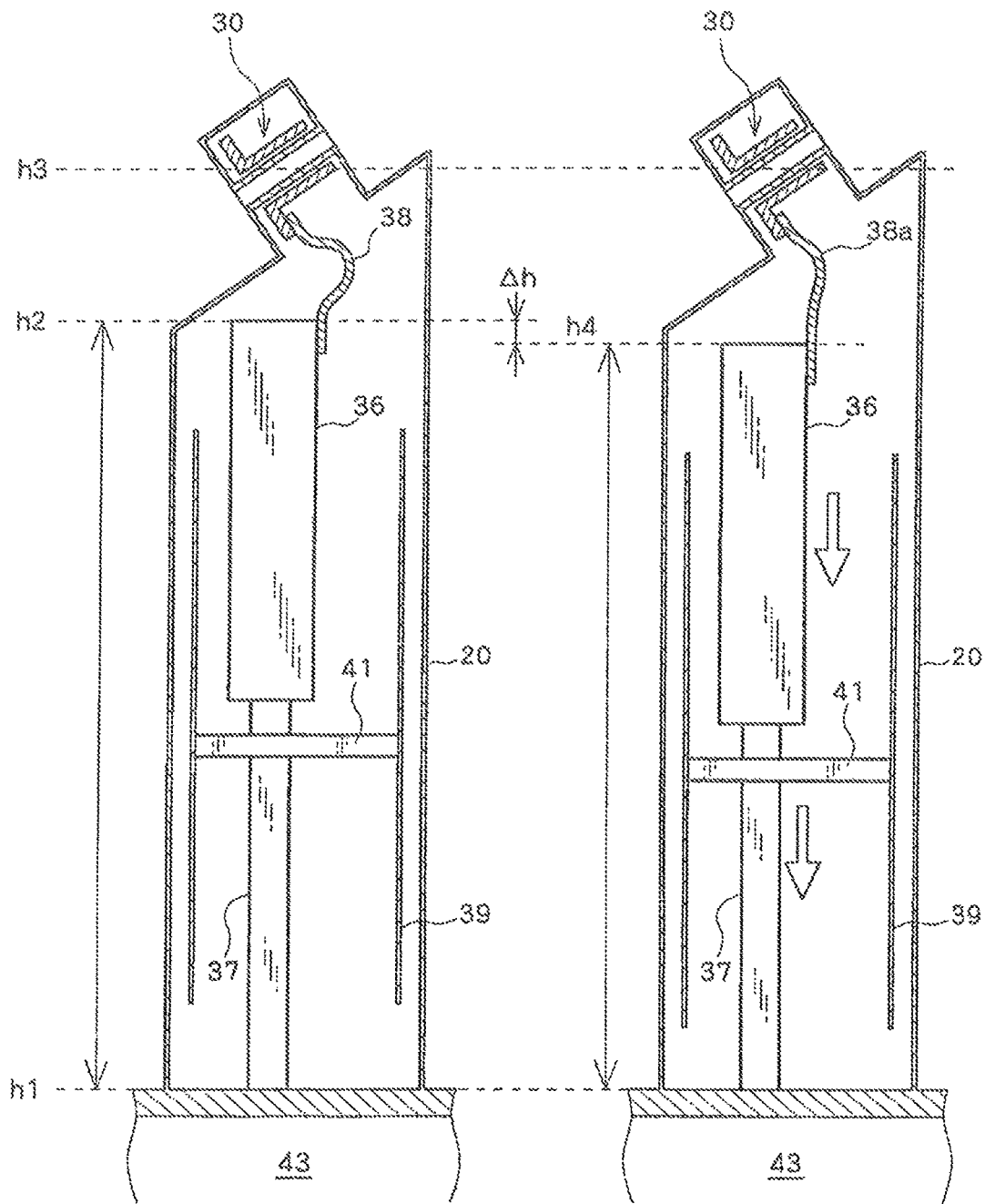
FIGS. 4A and 4B are schematic side elevations of the NMR detection probe shown in FIG. 1, illustrating displacements caused by shrinkage.
Figure 5:
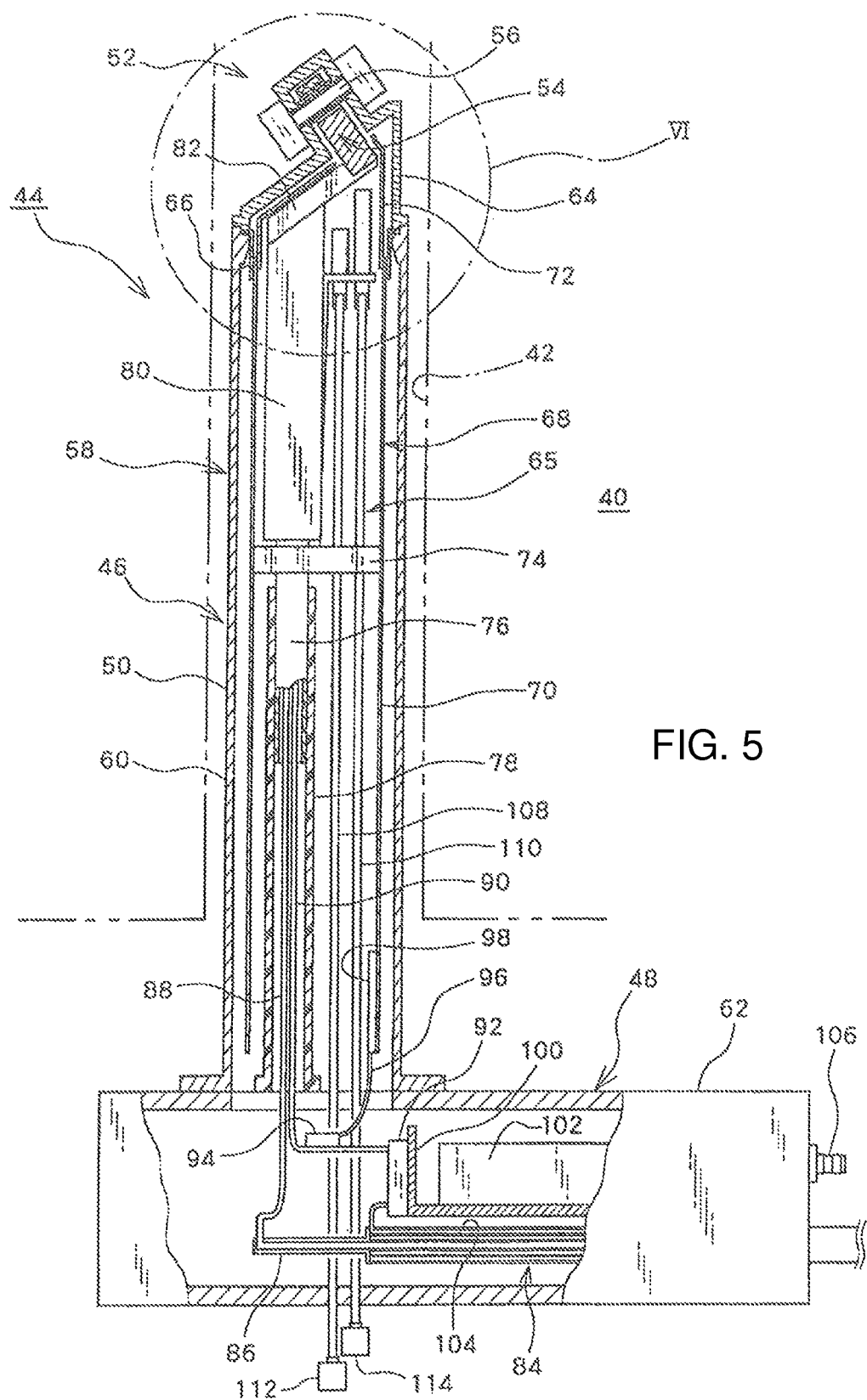
FIG. 5 is a vertical cross section of a cooled NMR detection probe according to a preferred embodiment of the present invention.

Referring to FIG. 5, there is shown a cooled type NMR detection probe according to one preferred embodiment of the present invention. This probe is used, for example, when the molecular structure of a sample is analyzed. In the present embodiment, the sample is a solid sample. In FIG. 5, for the sake of illustration, some components are omitted, and some components are shown in an exaggerated manner.

Referring still to FIG. 5, the NMR detection probe (hereinafter may be simply referred to as the NMR probe), 44, includes an insertion portion 46 and a lower unit 48. The insertion portion 46 is cylindrical in shape as a whole and extends vertically. The insertion portion 46 is inserted in a bore 42 formed in a static magnetic field generator 40. The insertion portion 46 includes a body 50 forming an intermediate member and a probe head 52 formed over the body 50. The probe head 52 has a spinning mechanism for holding and spinning the sample tube. Also, the probe head has a core module 54 (described in detail later). A vacuum vessel 58 that is a cryostat made of a partition wall utilizing a vacuum state is fabricated over the whole NMR probe 44. The vacuum vessel 58 is composed of a barrel 60 extending vertically, a lower housing 62 of the lower unit 48, and an upper partition wall 64. The inside of the vacuum vessel 58 is in a vacuum state. The outside of the vessel is in an atmospheric state. The barrel 60 and the upper partition wall 64 are made of a material (such as aluminum and FRP) that can provide sufficient structural strength without adversely affecting the magnetic field. The lower housing 62 is made of aluminum or other metal. The upper partition wall 64 includes a first part of triangular cross section as obtained by cutting a cylinder obliquely and a second part protruding perpendicularly to the tilted surface of the first part.

An internal structure 65 is accommodated in the vacuum vessel 58 of the insertion portion 46. The internal structure 65 includes a radiation shield assembly 68, a connecting member 74, a first heat exchanger 80, a slider 76, a support member 82 being a heat conducting member, and the above-mentioned core module 54.

A holding member 66 is used such that the internal structure 65 depends from and is secured to the top of the vacuum vessel 58. The holding member 66 is made of a heat insulating material such as FRP. As shown in the enlarged view of FIG. 6 that will be referenced later, the holding member 66 has a fixed, outer upper-end portion forming a jawlike portion protruding outwardly and horizontally. The holding member 66 has an inner lower-end holding portion to which the internal structure 65 is coupled. The holding member 66 has a vertically extending intermediate portion between the upper-end portion and the lower-end portion. The holding member 66 is so designed that the amount of heat flowing from the barrel 60 at room temperature into a shield body 70 (described later) kept at a low temperature is minimized. In the present embodiment, the whole holding member 66 is made of a highly heat insulating material. The presence of the intermediate portion between the upper-end portion and the lower-end portion increases the heat transfer distance. If the lower-end portion is displaced horizontally inwardly relative to the upper-end portion as a result of cooling, the intermediate portion follows the deformation. The upper-end portion of the holding member 66 is squeezed between the upper end of the barrel 60 and the lower end of the upper partition wall 64. In the present embodiment, the whole load of the internal structure 65 essentially depends on the holding member 66 from which the internal structure hangs. That is, the barrel 60 of the vacuum vessel 58 bears the whole load. Of course, a part of the load of the internal structure 65 can be supported at other location supplementarily.

The radiation shield assembly 68 is configured including the shield body 70 spaced from the barrel 60 along its inner surface and an upper shield member 72 mounted over the shield body 70. The shield body 70 is cylindrical in shape and has an upper end to which the upper shield member 72 is coupled. The upper shield member 72 is shaped along the profile of the inner surface of the upper partition wall 64. The radiation shield assembly 68 which is made of aluminum reflects infrared radiation emitted inwardly from the vacuum vessel 58 and prevents intrusion of infrared radiation into the interior. In the present embodiment, the shield body 70 indirectly supports the first heat exchanger 80 and bears its load. The lower-end portion of the holding member 66 is coupled to the location where the shield body 70 and the upper shield member 72 are connected together. The disklike connecting member 74 is mounted at an intermediate height inside the shield body 70 and held to the shield body 70. The connecting member 74 holds the slider 76 extending downward from a lower part of the first heat exchanger 80. The connecting member 74 is made of a heat insulating material such as FRP.

The first heat exchanger 80 is located in an upper part of the insertion portion 46, i.e., close to the core module 54. The first heat exchanger 80 has a multiplicity of fins therein to provide a wide heat exchanging surface area. The first heat exchanger 80 is cooled by a refrigerant (such as liquid helium) injected from an incoming refrigerant pipe 88. Warmed refrigerant is expelled from an outgoing refrigerant pipe 90. The first heat exchanger 80 has an inclined top surface to which the support member 82 is secured parallel to the inclined surface. The support member 82 extends parallel to the axis of rotation of a sample tube 56. The support member 82 is a block of a material of high thermal conductivity such as copper. The core module 54 is connected to the upper end of the support member 82. The core module 54 extends in a direction perpendicular to the longitudinal direction of the support member. The internal structure of the probe head 52 will be later described with reference to FIG. 6.

The cylindrical slider 76 is mounted in a lower part of the first heat exchanger 80 and has a lower-end portion inserted in a cylindrical slider guide 78 that is raised from and fixed to the lower housing 62. Consequently, the slider 76 is held so as to be slidable in an up-and-down direction. The combination of the slider 76 and the slider guide 78 determines the horizontal position of the internal structure 65 and prevents the lower part of the internal structure 65 from swinging. The slider 76 and slider guide 78 are made of a heat insulating material such as FRP.

A support stage is mounted on a side surface of the first heat exchanger 80. Two electronic parts such as variable capacitors are mounted on the support stage and cooled. These electronic parts cooperate with the transmit/receive coil to form a tuning and matching electronic circuit. Control rods 108 and 110 have their upper ends mounted to the electronic parts, respectively. The control rods 108 and 110 have their lower ends protruding through the lower housing 62. Control knobs 112 and 114 are attached to the exposed lower ends of the control rods 108 and 110, respectively. The electronic parts may be configured to be automatically adjusted.

A second heat exchanger is mounted across the insertion portion 46 and the lower unit 48. The second heat exchanger includes a metal plate 94 connected to an intermediate portion of the outgoing refrigerant pipe 90, a flexible heat link 96, and a metal mesh 98. These parts are made of a thermally-conductive material such as copper. The heat link 96 acts to transfer heat between the metal plate 94 and the metal mesh 98. Because the heat link 96 is made of a flexible material, if the shield body 70 shrinks upward, the heat link 96 merely deforms conformally. The heat transfer action of the heat link 96 is maintained. The shield body 70 is cooled by this second heat exchanger.

A third heat exchanger 92 is mounted inside the lower unit 48 and secured to a support stage 100. The outgoing refrigerant pipe 90 is connected to the third heat exchanger 92, and refrigerant is received from the outgoing pipe 90. The third heat exchanger 92 is made of a simple copper plate or copper block. Electronic circuitry (such as a duplexer circuit and a preamplifier) 102 is mounted on the support stage 100 such that the electronic circuitry 102 is cooled effectively. An electrical connector is indicated by 106. A transfer tube 84 of coaxial triple tube structure is drawn in the lower unit 48. The central tube is connected with the incoming refrigerant pipe 88, while the outer tube 104 is connected with the refrigerant exit of the third heat exchanger 92. An annular gap forming a vacuum layer is present between the central tube and the outer tube. A suction pipe (not shown) is mounted in the lower housing 62, and a vacuum pump (not shown) is connected with this suction pipe.

Figure 6:
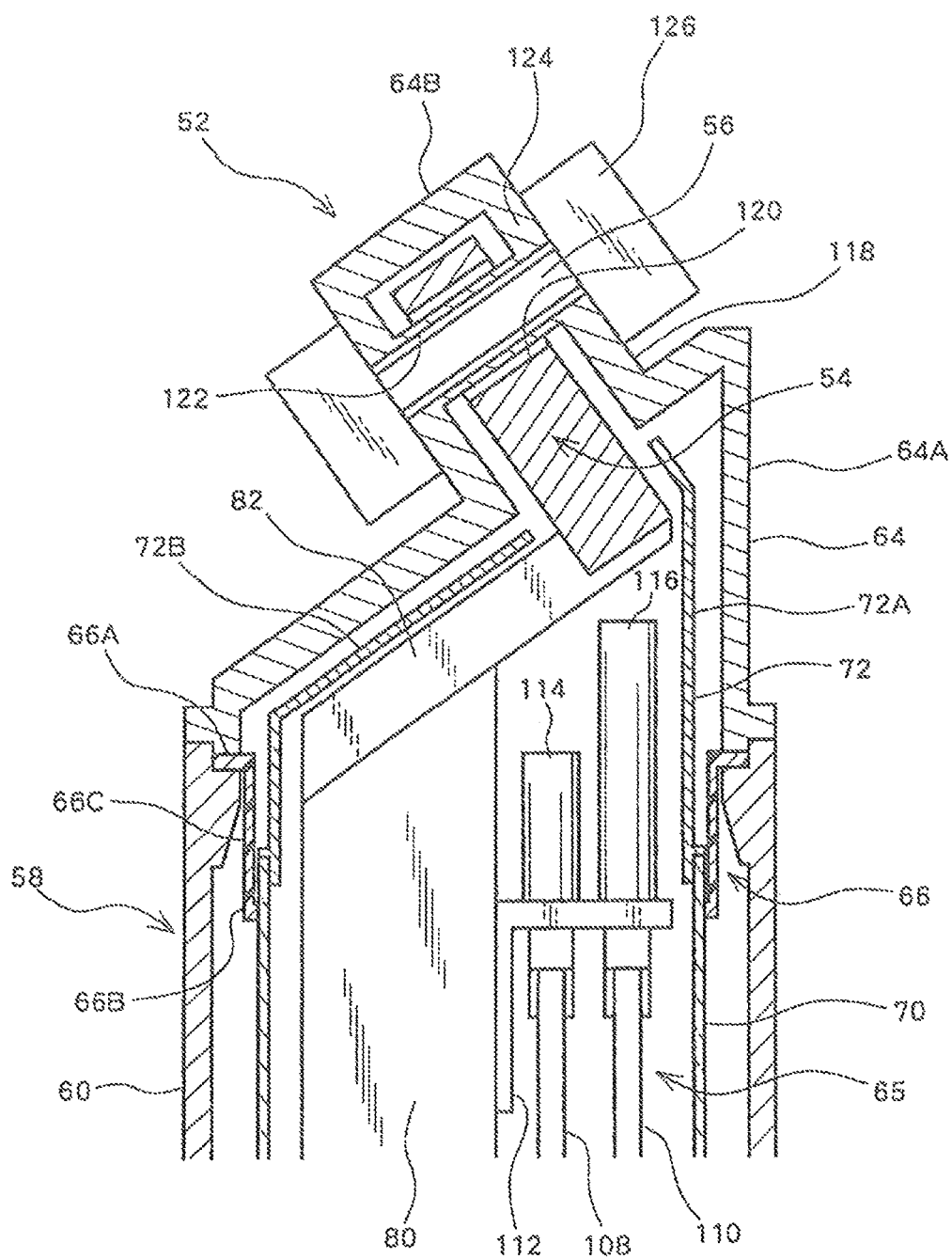
FIG. 6 is an enlarged view taken along line VI of FIG. 5.

FIG. 6 is an enlarged view taken along line VI of FIG. 5. As noted above, the internal structure 65 fixedly depends from the vacuum vessel 58 via the holding member 66. The holding member 66 has an upper-end portion 66A, a lower-end portion 66B, and an intermediate portion 66C between them. The upper-end portion 66A forms a jawlike portion squeezed between the barrel 60 and the upper partition wall 64. The intermediate portion 66C is bent from the upper-end portion 66A and extends downward. The lower-end portion 66B is coupled to the shield body 70 and holds it. The intermediate portion 66C is disposed in a gap space extending in an up-and-down direction through the vacuum vessel 58. The intermediate portion 66C extends in the up-and-down direction. Preferably, the intermediate portion 66C is configured not to touch any other member, in which case the heat insulating action can be enhanced. If a simple annular member stretching horizontally were used as the holding member 66, the distance between the outer end and the inner end would be almost null. In this case, high heat insulation would not be obtained. Furthermore, it would be difficult to absorb displacement due to contraction caused by cooling. In contrast, in the above-described structure, the heat insulating performance can be enhanced by making the holding member 66 extend in the up-and-down direction by making use of the finite space in the vacuum vessel 58. As cooling proceeds, the internal structure 65 (especially, the shield body 70) contracts and its diameter decreases. If the lower-end portion 66B is displaced horizontally inwardly relative to the upper-end portion 66A, the intermediate portion 66C deforms to thereby absorb the displacement. That is, if there are internal temperature variations, the holding action of the internal structure 65 can be maintained.

The holding member 66 is directly coupled to the shield body 70, not to the first heat exchanger 80. The shield body 70 made of aluminum, the connecting member 74 (FIG. 5) made of a heat insulative material, and the slider 76 (FIG. 5) made of a heat insulative material are present between the holding member 66 and the first heat exchanger 80. In this way, the heat transfer path from the holding member 66 to the first heat exchanger 80 is intentionally prolonged. Furthermore, heat insulating members are inserted in plural stages along the path. The amount of heat transmitted from the vacuum vessel 58 to the internal structure (especially, the core module 54) is reduced to a minimum.

A support stage 112 is mounted on a side surface of the first heat exchanger 80. Variable capacitors 114 and 116 are mounted on the stage 112. For example, "cryogenic tunable trimmer" capacitor NMCB10-5CKE available from Voltronics Corporation can be used as these variable capacitors. The support stage 112 is made of a highly heat conducting material such as copper. A lower-end portion of the support member 82 made of a heat conducting material is coupled to an upper part of the first heat exchanger 80. The core module 54 is connected to the upper-end portion of the support member 82. As described previously, the support member 82 extends parallel to the axis of rotation of the sample. The core module 54 extends at right angles to the support member 82, i.e., perpendicularly to the axis of rotation of the sample.

The core module 54 includes a refrigerant block (cooling block) 118 and a transmit/receive coil 120. The refrigerant block 118 is a basic body of the transmit/receive coil 120 and acts also to cool the transmit/receive coil 120. Preferably, the refrigerant block 118 has a shape of a rectangular cylinder that has a base-end portion and a front-end portion. The base-end portion is connected to the support member 82. A detection hole made of a through-hole is formed in the front-end portion. The transmit/receive coil 120 is formed on the inner surface of the detection hole. The coil 120 is formed as a patterned conductive film. The central axis of the detection hole is coincident with the axis of rotation of the sample. The upper partition wall 64 has a lower part 64A of triangular cross section and a protruding portion 64B raised vertically from an inclined plate possessed by the lower part 64A. Furthermore, the upper partition wall 64 has a sleeve (cylindrical partition wall) 122 disposed around the axis of rotation of the sample. The sleeve 122 is made of a highly heat insulative material such as a composite material of a ceramic and FRP. The transmit/receive coil 120 and the refrigerant block 118 are mounted around the sleeve 122. The sleeve 122 is in contact neither with the transmit/receive coil 120 nor with the inner surface of the detection hole. It is assured that there is a heat-insulating vacuum layer between the sleeve 122 and the coil 120. The sample tube 56 is inserted in the sleeve 122 in a non-contacting manner. A sample spinning mechanism 126 is mounted at the opposite ends of the sample tube 56. The spinning mechanism 126 is secured to the protruding portion 64B, which is provided with a passage (not shown) to permit the sample tube to be inserted and withdrawn. The upper shield member 72 is composed of a part 72A covering the core module 54 up to its lower end and a part 72B providing a cover over the support member 82.

In the configuration of the present embodiment, the solid sample at room temperature and atmospheric pressure is spun at high speed. The detection system is placed at low temperature in a vacuum. An NMR signal from the solid sample is detected by the detection system. The core module 54 forms a chief part of the detection system. The transmit/receive coil 120 included in it is cooled very well by the above-described structure. The core module 54 itself is completely isolated from the vacuum vessel 58. The aforementioned bobbin (core around which an outer winding is formed) or the like is not used.

(2) Core Module

Figure 7:
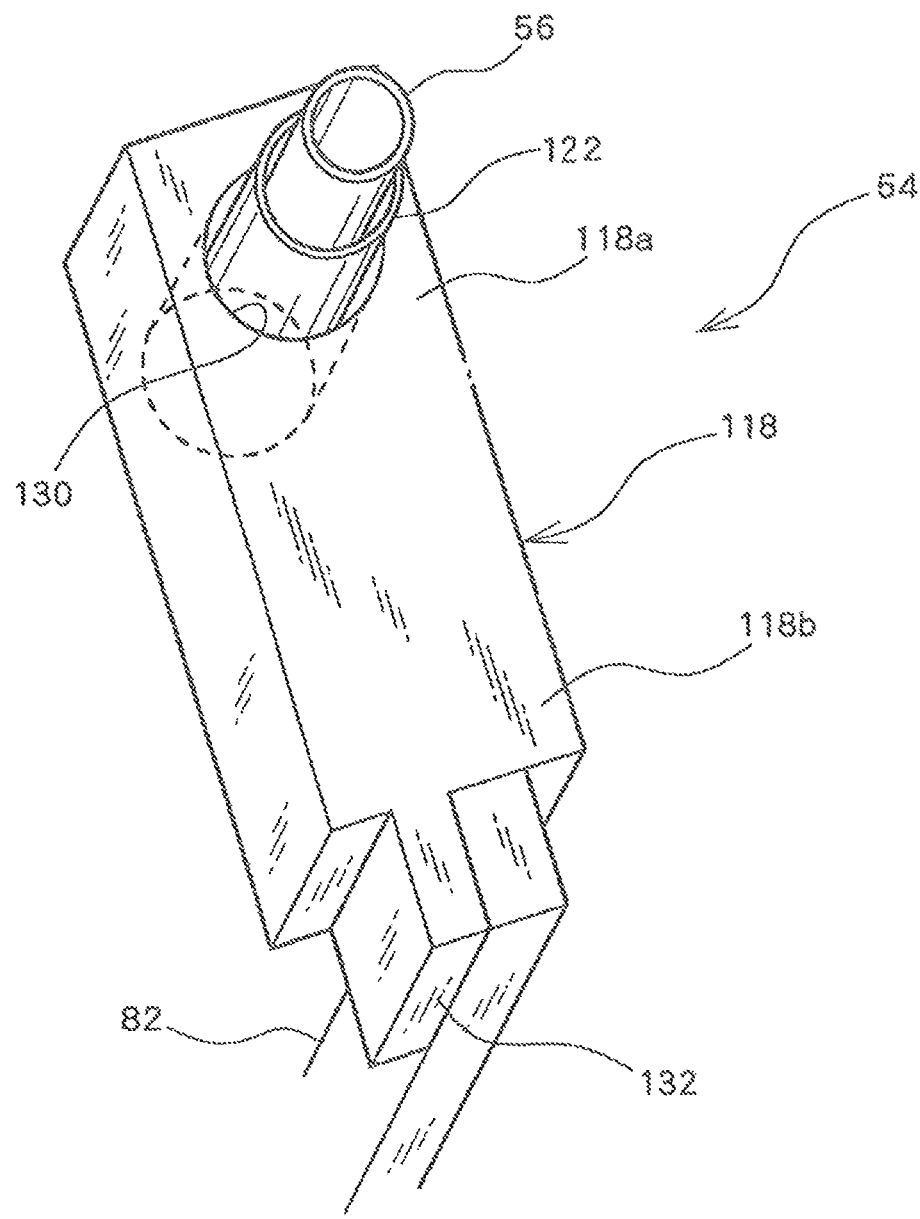
FIG. 7 is a perspective view of one example of core module.

FIG. 7 is a perspective view of the core module 54. The refrigerant block 118 is shaped as a rectangular cylinder as a whole. The block has a front-end portion 118a provided with a detection hole 130 that is a through-hole. A solenoidal transmit/receive coil is formed on the inner surface of the detection hole 130. In FIG. 7, the sleeve 122 forming a vacuum partition and the sample tube 56 are shown. These are coaxially disposed in the detection hole 130. The refrigerant block 118 has a base-end portion 118b on which a protruding portion 132 is formed. The protruding portion 132 and the support member 82 are tightened together via bolts while the contact surface of the protruding portion 132 is coupled to the contact surface of the support member 82. The refrigerant block 118 is preferably made of a dielectric material which has a low dielectric constant and a low dielectric loss and which exhibits a high thermal conductivity at low temperatures (below 20 K). Typically, the refrigerant block is made of a-alumina crystal (sapphire) of high purity (more than 99.9%). When temperature varies between low temperature and room temperature (between 10 K and 300 K), the integrated relationship between the transmit/receive coil and the refrigerant block 118 is maintained. That is, if such temperature variations occur, the transmit/receive coil is prevented from peeling or breaking.

Figure 8:
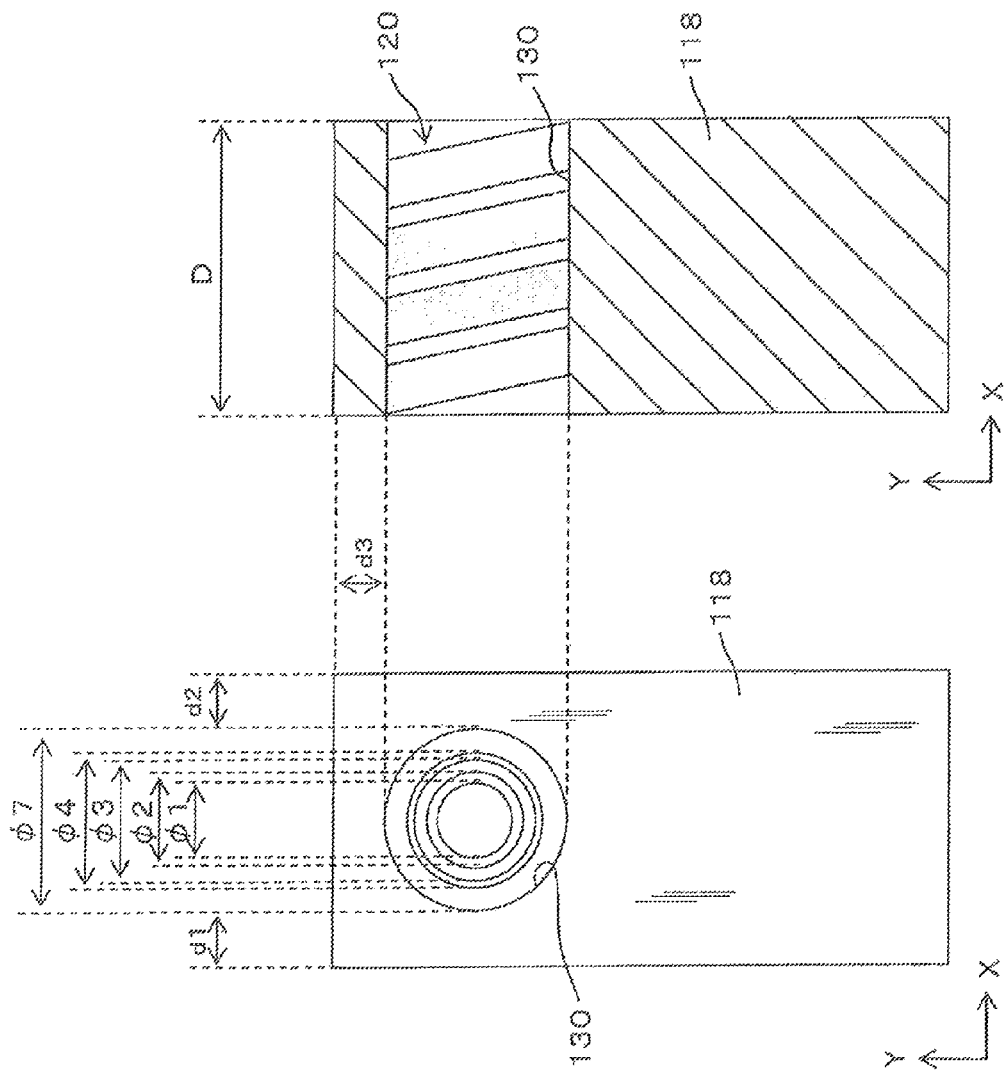
FIG. 8A is a plan view of the core module shown in FIG. 7.
FIG. 8B is a cross section of the core module shown in FIG. 7.

FIG. 8A is a front elevation of the core module. FIG. 8B is a vertical cross section of the core module. In FIG. 8A, the sample tube is shown to have an inside diameter of $\phi 1$ and an outside diameter of $\phi 2$. The sleeve is shown to have an inside diameter of $\phi 3$ and an outside diameter of $\phi 4$. The detection hole 130 is shown to have an inside diameter of $\phi 7$. In the present embodiment, no bobbin is used. The inside diameter of the transmit/receive coil is made smaller than heretofore and can be brought closer to the sample. The outside diameter $\phi 2$ of the sample tube is several millimeters, e.g., 2.5 mm or 3.2 mm. The inside diameter $\phi 7$ of the detection hole 130 is 8.1 mm, for example. Preferably, the ratio of the inside diameter $\phi 7$ of the detection hole 130 to the outside diameter $\phi 2$ of the sample tube falls within a given range. The detection hole 130, i.e., the transmit/receive coil, is totally surrounded by the refrigerant block 118. The transmit/receive coil is substantially buried in the refrigerant block 118. Wall thicknesses d1, d2, and d3 around the detection hole 130 are 5 mm or more, for example. Preferably, the wall thicknesses are 1 cm or more. Note that numerical values given in the present specification are merely exemplary.

In FIG. 8B, a conductive pattern of film is formed as the transmit/receive coil 120 on the inner surface of the detection hole 130. The coil 120 has a cylindrical shape whose central axis is in the direction of the magic angle relative to the static magnetic field. The coil 120 transmits RF power of a carrier frequency that is the Larmor frequency (several MHz to hundreds of MHz) of the nuclide under investigation included in the sample. An induced NMR signal arising from the nuclide under investigation is detected by the coil 120. The transmit/receive coil 120 is in a ribbon-like or belt-like form having a slight radial thickness. The film thickness is, for example, between more than 10 μm and hundreds of μm or less. Preferably, the film thickness is set to more than 50 μm and less than 200 μm. The transmit/receive coil 120 is made of a conductive material that shows a high electrical conductivity (low RF resistance) at room temperature and at low temperatures. Typically, the coil is made of high-purity oxygen-free copper. The length of the coil 120 is equivalent to the thickness D of the refrigerant block 118. The cross-sectional area of the refrigerant block 118 is constant along its longitudinal direction (along the Y-axis). That is, the depthwise dimension D is kept constant. Also, the vertical and lateral dimensions are kept constant. The transmit/receive coil 120 is solenoidal in shape. Other types of transmit/receive coils such as saddle-type Helmholtz coils may also be employed. The number of turns of the transmit/receive coil is 3 to 5, for example. Preferably, the number is 4.

In fabricating the coil, the whole inner surface of the detection coil is first plated with a metal. A conductive coating is formed on this layer. Then, the conductive coating is patterned and etched to complete the transmit/receive coil 120. In this case, a pattern of extraction electrodes (described below) can be fabricated at the same time. Various coils can be fabricated easily by utilizing the technique described so far.

Figure 9:
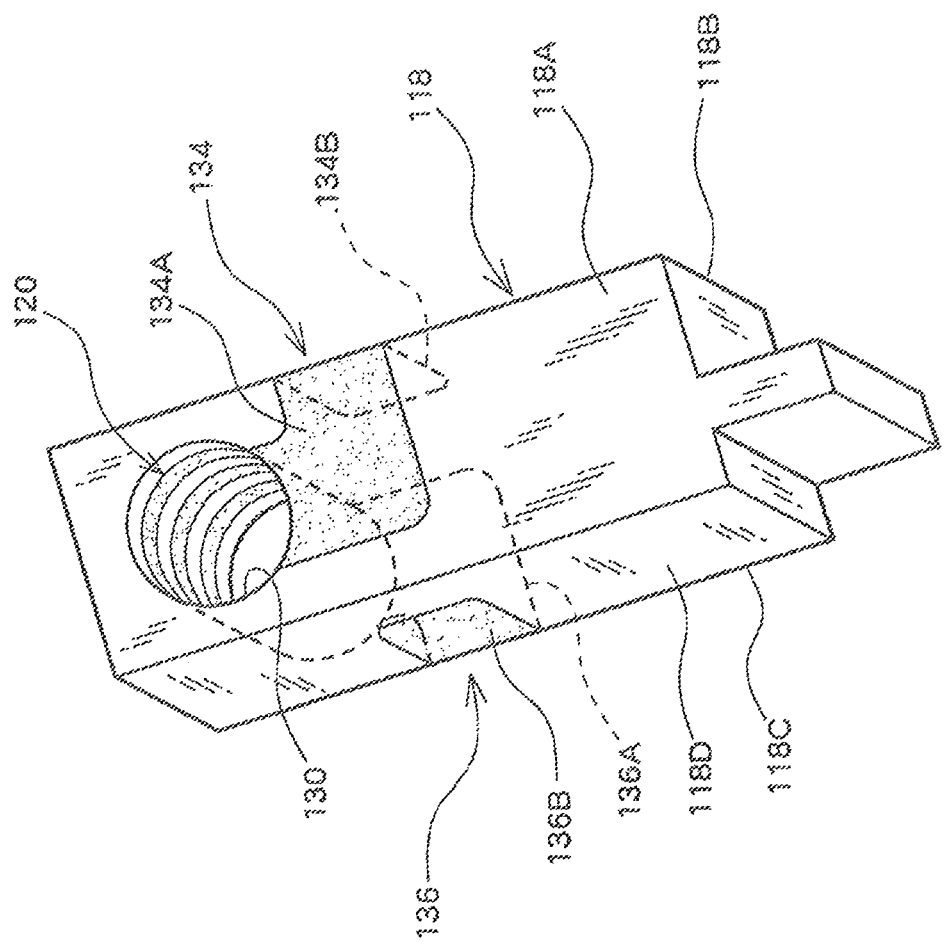
FIG. 9 is a perspective view of a refrigerant block (cooling block) on which a pair of extraction electrodes is formed.

Referring to FIG. 9, there is shown a core module having a layer in which a pair of extraction electrodes is formed. The refrigerant block 118 has a front surface 118A on which a part 134A of a first extraction electrode 134 is formed. The block 118 has a right side surface 118B on which the remaining part 134B of the first extraction electrode 134 is formed. The first extraction electrode 134 is formed as a conductive film and connected with one end of the transmit/receive coil 120. The detection hole 130 has first opening fringes that have been chamfered to permit reliable connection between the transmit/receive coil 120 and the first extraction electrode 134. The refrigerant block 118 has a rear surface 118C on which a part 136A of a second extraction electrode 136 is formed. The block 118 has a left side surface 118D on which the remaining part 136B of the second extraction electrode 136 is formed. The second extraction electrode 136 is formed as a conductive film in the same way as the first extraction electrode 134, and is connected with the other end of the transmit/receive coil 120. Second opening fringes of the detection hole 130 are also chamfered to permit reliable connection between the transmit/receive coil 120 and the second extraction electrode 136. Other edges of the refrigerant block 118 may also be chamfered. In this structure, when wires are connected to the transmit/receive coil, the connection work of signal lines can be performed reliably using idle surfaces.

Figure 10:
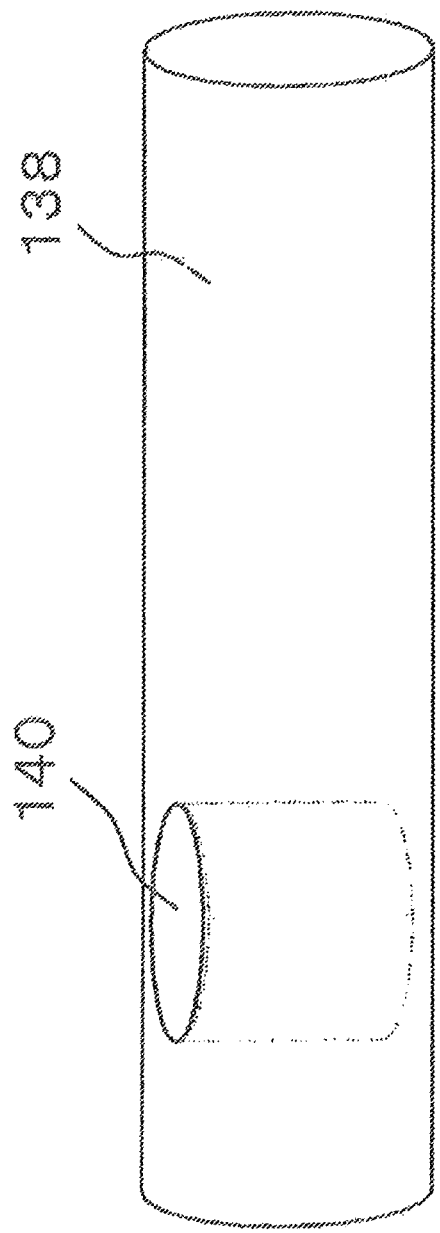
FIG. 10 is a perspective view of a second example of refrigerant block.
Figure 11:
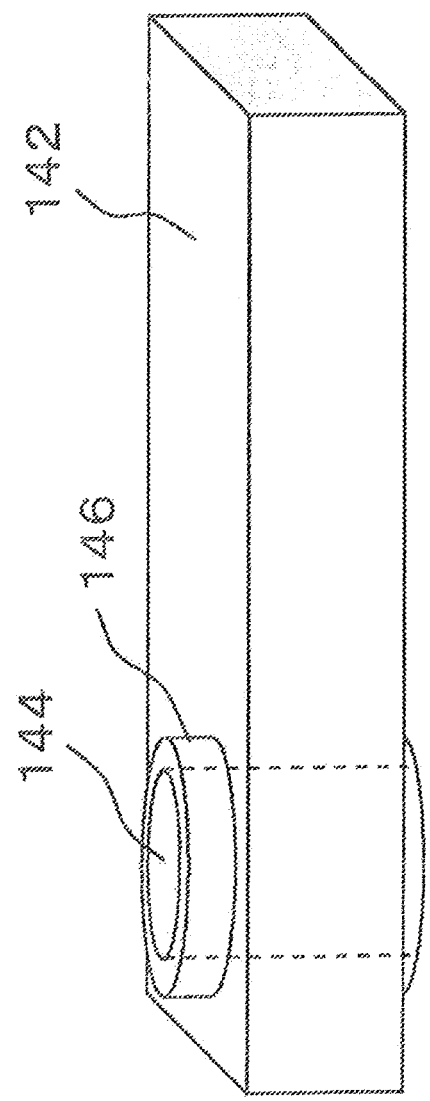
FIG. 11 is a perspective view of a third example of refrigerant block.
Figure 12:
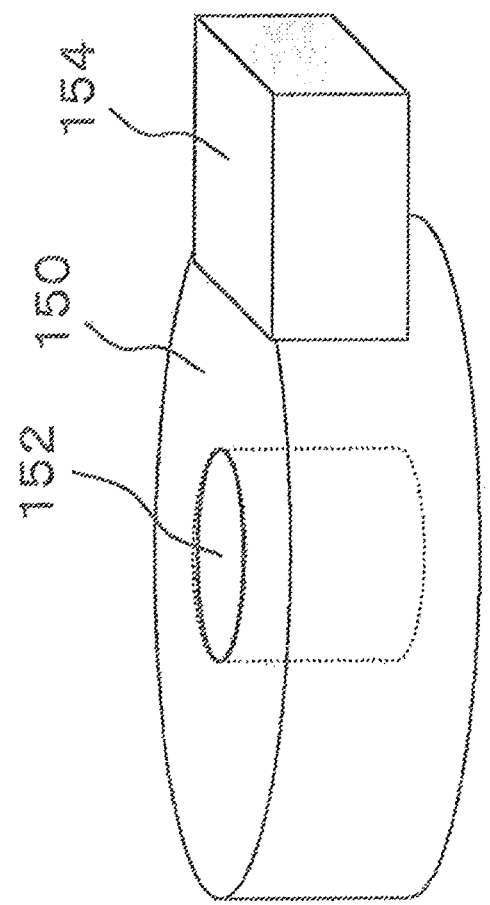
FIG. 12 is a perspective view of a fourth example of refrigerant block.

Referring to FIG. 10, there is shown a second example of core module. In this example, a cylindrical refrigerant block 138 is employed. The block has a front-end portion in which a detection hole 140 is formed. A third example of core module is shown in FIG. 11. In this example, a refrigerant block 142 assumes the form of a rectangular cylinder having a detection hole 144. Annular swelling portions 146 are formed at the front and rear surfaces, respectively, of the block 142 to elongate the inner surface of the detection hole 144 along its central axis. A fourth example of core module is shown in FIG. 12. In this example, a disklike refrigerant block 150 of large diameter has a detection hole 152 in its central portion (which may also be referred to as a front-end portion). The block 150 has a protruding portion 154 in its outer portion (which may also be referred to as a base-end portion) for connecting purposes. In this way, the refrigerant block can take various forms. Preferably, the volumetric heat capacity is set larger to cool the transmit/receive coil sufficiently. Furthermore, the thermal cross section is preferably set large for heat transfer.

(3) Holding Structure

Figure 13:
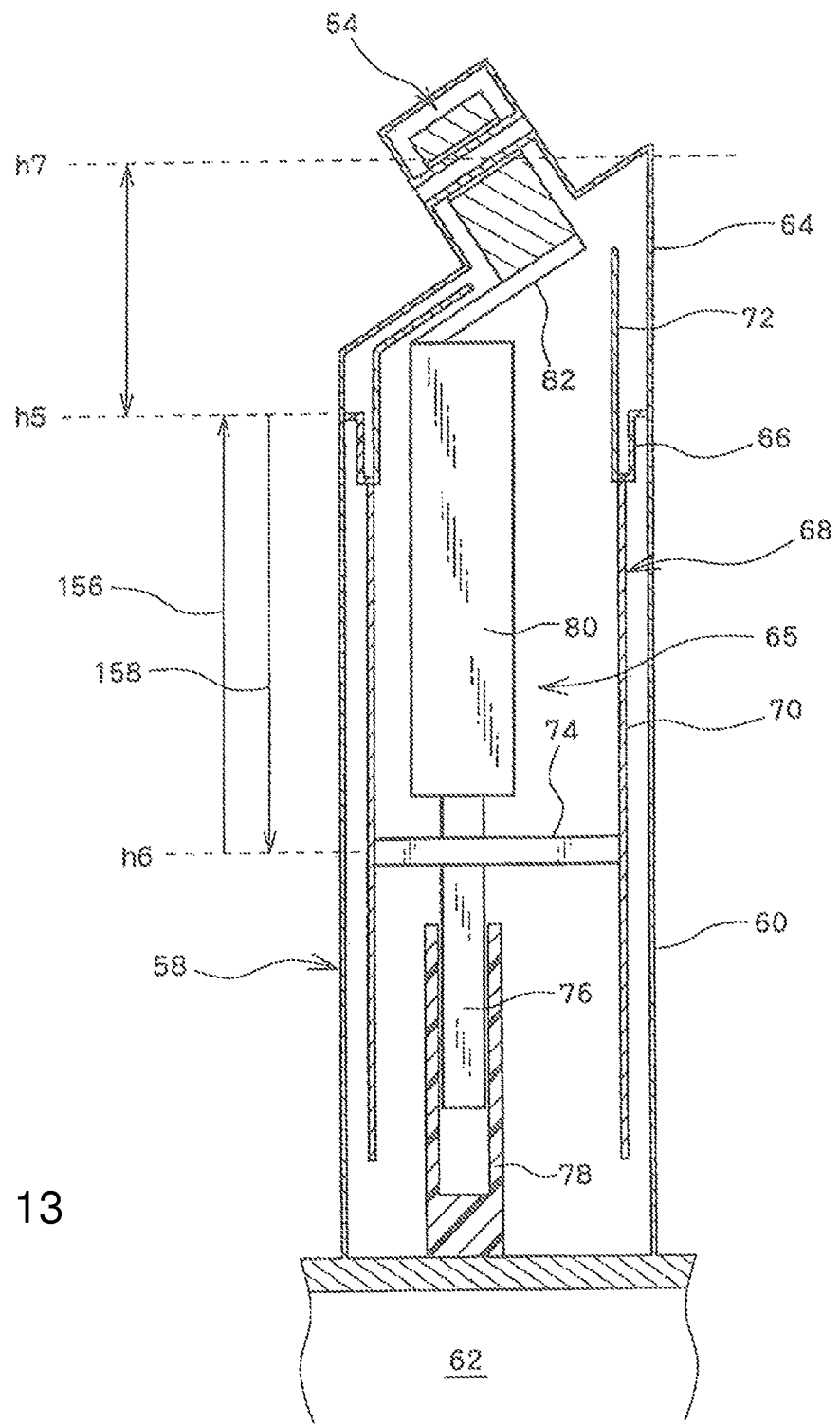
FIG. 13 is a schematic vertical cross section of the NMR detection probe shown in FIG. 5, illustrating the operation of the probe and a first example of holding structure.

FIG. 13 schematically shows the NMR probe shown in FIG. 5. The internal structure 65 is mounted in the vacuum vessel 58. In particular, the internal structure 65 is held to the vacuum vessel 58 by the hanging holding member 66. As described previously, the internal structure 65 includes the radiation shield assembly 68, the connecting member 74, the first heat exchanger 80, the support member 82, and the core module 54. The cylindrical slider 76 is mounted under the first heat exchanger 80. The lower-end portion of the slider 76 is slidably inserted in the cylindrical slider guide 78. Consequently, the internal structure is placed in position horizontally in a lower part thereof. The radiation shield assembly 68 includes the shield body 70 and the upper shield member 72. A reference height is indicated by h5. A height at which the detection center exists is indicated by h6.

During cooling, the components of the internal structure 65 shrink according to their respective intrinsic linear coefficients of expansion. At this time, the internal structure 65 is held by the holding member 66 and, therefore, the various members are displaced toward the reference height h5. More specifically, the part of the shield body 70 from the holding member 66 to the connecting member 74 shrinks upward as indicated by 156. On the other hand, the part of the shield body from the connecting member 74 to the vicinities of the top of the first heat exchanger 80 shrinks downward as indicated by 158. In this way, the two parts shrink in mutually opposite directions. Therefore, their displacements essentially cancel out each other. Since the materials constituting the members are different, they do not cancel out each other strictly. However, displacements caused by shrinkage are canceled out sufficiently. It is considered that the portion from the top part of the first heat exchanger 80 to the transmit/receive coil of the detection core module also shrinks. This portion is relatively short and so the displacement of this portion can be suppressed within a tolerable range. That is, the positional relationship of the center of the transmit/receive coil relative to the height h6 of the detection center can be substantially kept constant. Issues of contact of the core module 54 can be effectively circumvented. The clearance is 0.4 to 0.5 mm, for example. Of course, the magnitude of the clearance may vary depending on conditions. Although other parts also shrink, no great problems take place. If the slider 76 shrinks upward due to the above-described shrinkage, its motion is tolerated by the slider guide 78.

The vacuum vessel 58 of the present embodiment acts not only as a container but also as an outer structural member. That is, the internal structure 65 depends from and is supported by the vacuum vessel 58. Since the core module 54 itself is not directly held to the vacuum vessel 58, the cooled state of the core module 54 is maintained well. Since the path from the holding member 66 to the first heat exchanger 80 (and eventually to the core module 54) is very long, the amount of heat transferred from the vacuum vessel 58 is quite small. Furthermore, the holding member 66 is allowed to extend in the up-and-down direction by making effective use of the narrow gap. Hence, the heat transfer through this region is also effectively suppressed. As a result, the core module 54 and other components can be cooled effectively and their cooled state can be maintained. This is combined with improved performance of the core module 54 to yield greatly improved sensitivity. It has been experimentally confirmed that approximately 3 to 4 times improvements in sensitivity over the prior art technique stated above are achieved.

Figure 14:
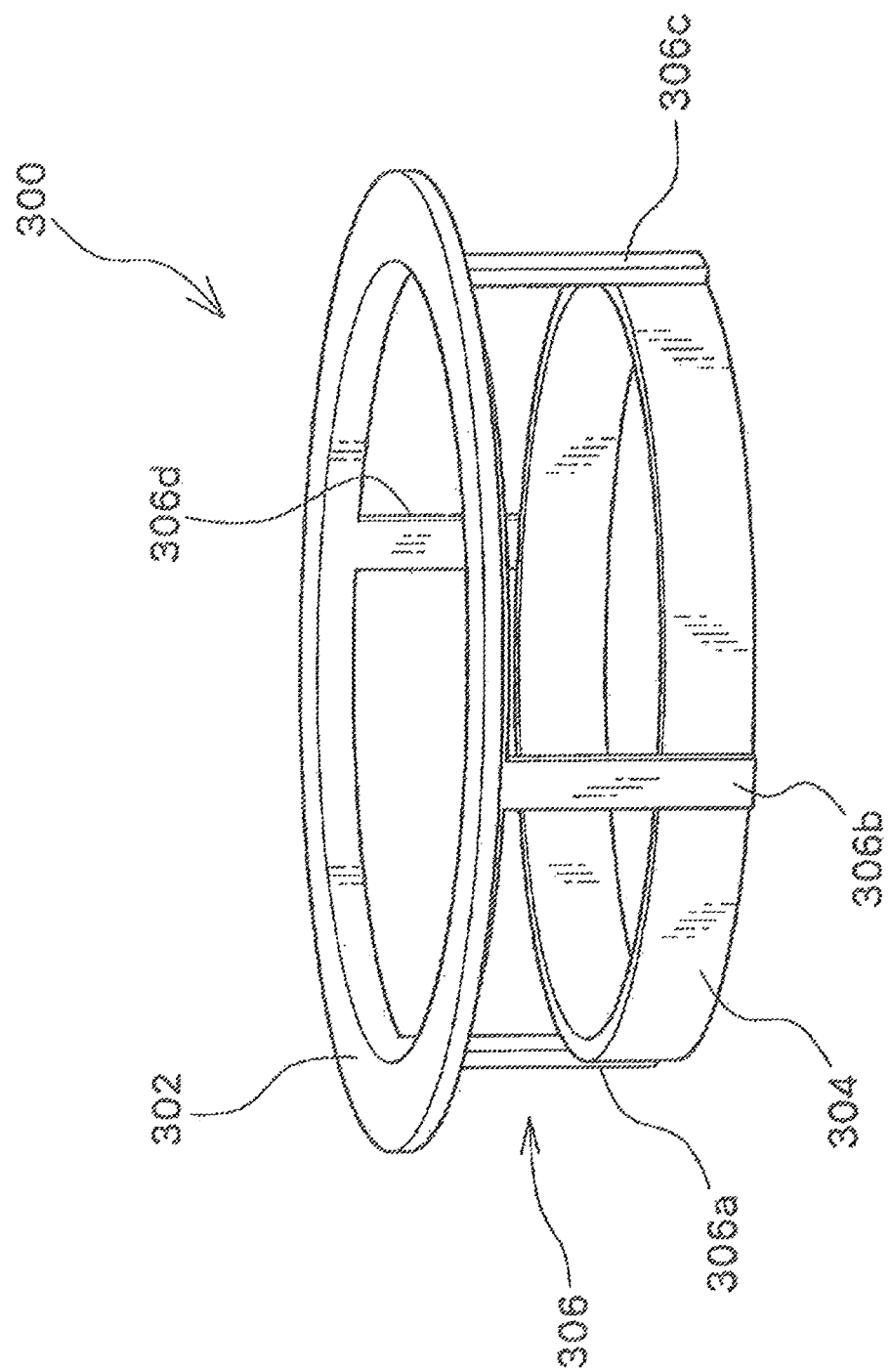
FIG. 14 is a perspective view of a first example of securing member.

A first example of the holding member is shown in FIG. 14. The holding member, 300, includes an annular upper-end portion 302 spreading horizontally, a cylindrical lower-end portion 304 holding the internal structure (not shown), and an intermediate portion 306 mounted between the upper-end portion 302 and the lower-end portion 304. The intermediate portion 306 is composed of a plurality of circumferentially regularly spaced links 306a-306d each of which is a flat plate-like member extending in an up-and-down direction. Although the intermediate portion 306 can be designed as a cylindrical member, it is desired to use the circumferentially spaced narrow links 306a-306d as the intermediate portion 306 to minimize the amount of inflow of heat by reducing the cross section of thermal conduction. The upper ends of the links 306a-306d are connected to the upper-end portion 302. The lower ends of the links 306a-306d are connected to the lower-end portion 304. When the internal structure shrinks and concomitantly the diameter of the lower-end portion 304 decreases, the links 312a-312d deform, urging the lower ends of the links 306a-306d inwardly and toward each other. This assures that the internal structure is kept held. In the first embodiment, there are four links 312a-312d. The number of links may be set at will. This principle also applies to the following second example.

Figure 15:
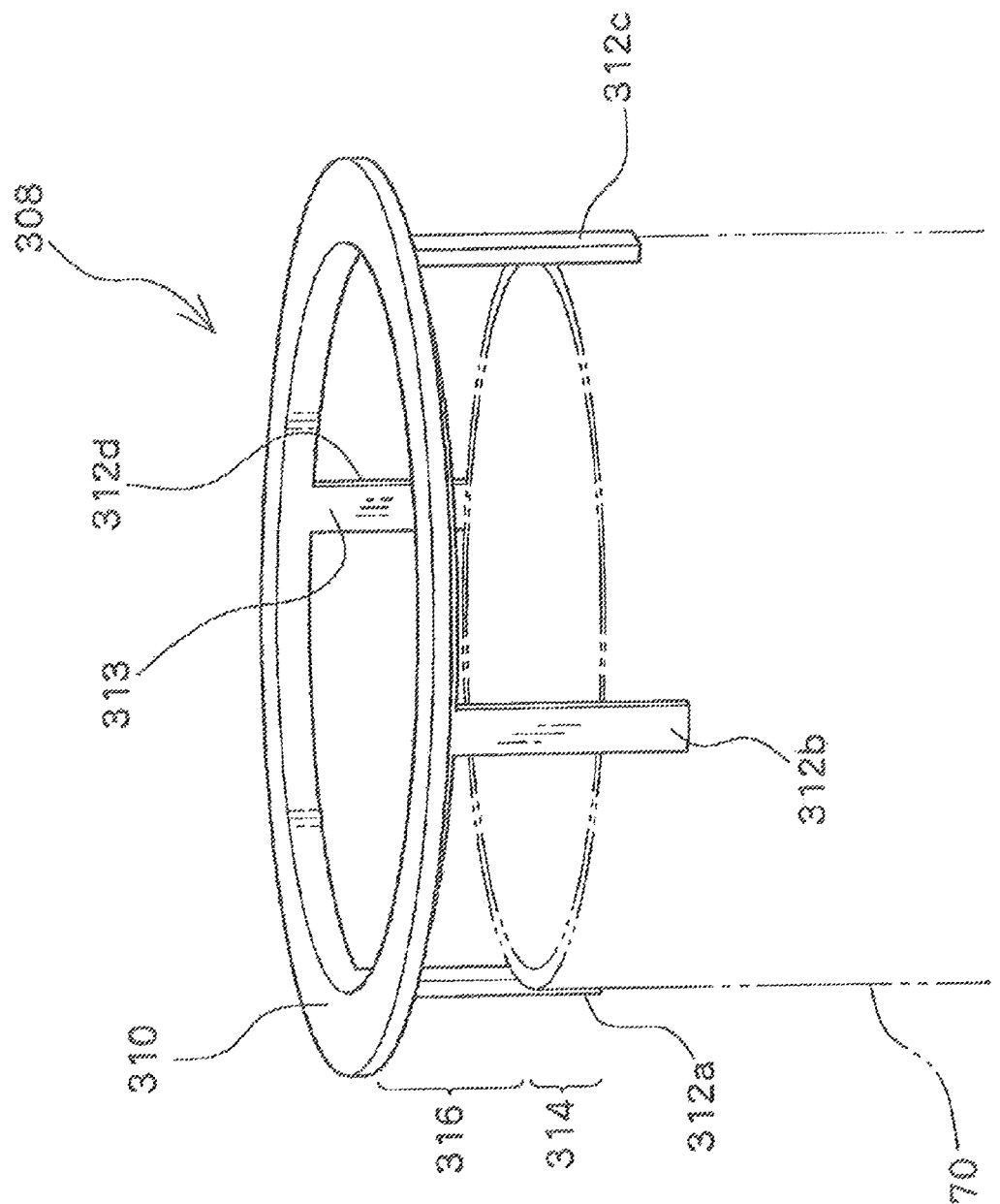
FIG. 15 is a perspective view of a second example of securing member.

A second example of the holding member is shown in FIG. 15. The holding member, 308, includes an annular upper-end portion 310 spreading horizontally and a plurality of links 312a-312d. In this second example, the links 312a-312d perform the function of an intermediate portion and the function of a lower-end portion. That is, the upper ends 313 of the links 312a-312d are held to the upper-end portion 310, while the lower ends 314 hold the shield body 70. A portion 316 between the upper end 313 and the lower end 314 of each link forms an intermediate portion that is a redundant portion or deformable portion. This structure yields the same advantageous effects as the first example.

Figure 16:
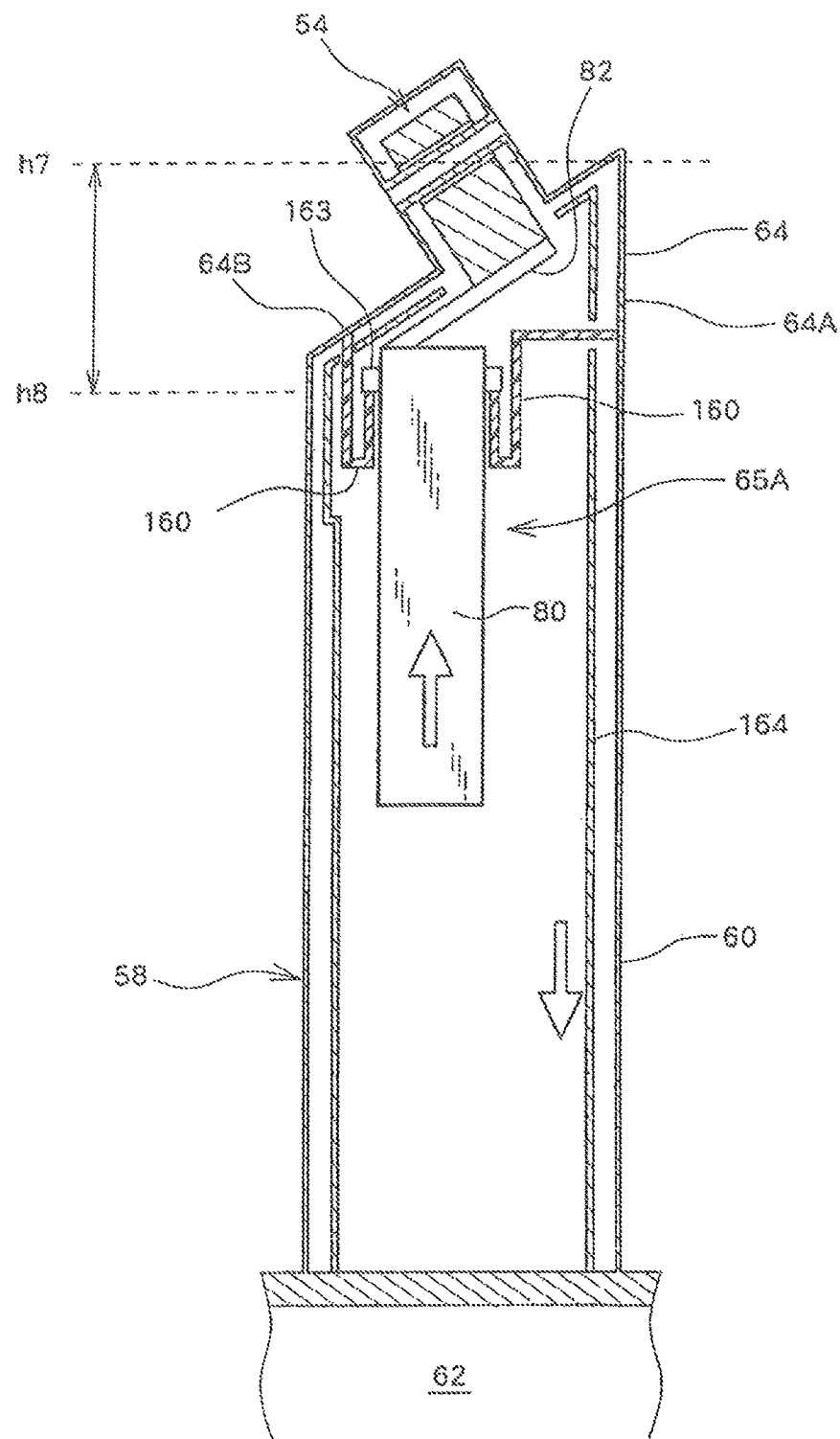
FIG. 16 is a schematic vertical cross section of a second example of holding structure.

A modified example of the holding structure is shown in FIG. 16. Those components of FIG. 16 which are identical in structure with their counterparts of FIG. 13 are indicated by the same reference numerals as in FIG. 13 and their description is omitted. In FIG. 16, a radiation shield 164 is fixedly mounted on the lower housing 62. The first heat exchanger 80 has a jawlike portion 163 on its side surface. A holding member 160 is mounted between the jawlike portion 163 and the vacuum vessel 58. The holding member 160 is disposed, for example, around a given part of the periphery of the first heat exchanger 80. For instance, the holding member 160 may be composed of a first part mounted on one side of the first heat exchanger 80 and a second part mounted on the other side of the first heat exchanger 80. The holding member 160 is made of a heat insulating material such as FRP. The holding member 160 has a fixed outer end portion and a holding inner end portion. The outer end portion is coupled to the lower surface of a tilted surface 64B of the upper partition wall 64 of the vacuum vessel 58 and to the inner surface of a cylindrical plate 64A. The inner end portion supports the jawlike portion 163. The intermediate portion between the outer end portion and the inner end portion is bent to and fro in an up-and-down direction, providing an increased heat transfer distance. Furthermore, such serpentine form absorbs displacement caused by shrinkage. The radiation shield 164 is not in contact with the holding member 160. The radiation shield 164 is provided with openings at requisite locations to permit passage of the holding member 160. The core module is connected to the first heat exchanger 80 via the support member 82. In the structure shown in FIG. 16, neither the slider nor the slider guide is mounted. The hanging subject is supported only by the holding member 160. In the structure shown in FIG. 16, the internal structure 65A to be held is composed of the first heat exchanger 80, the support member 82, and the core module 54.

In this structure, a reference height is indicated by h7. During cooling, various parts of the first heat exchanger 80 shrink and are displaced toward the reference height h7. If a lower part of the first heat exchanger 80 is displaced upward, this displacement does not reach the core module 54. If a part located above the reference height h7 shrinks, the position of the transmit/receive coil might be affected. However, this part is quite short and so if this part shrinks, the displacement can be held within the clearance. If the radiation shield 164 shrinks, a part located over this shield will be greatly displaced downward. This shrinkage will present no problem if a sufficient amount of clearance is secured above the radiation shield 164. This structure has the advantage that the weight of the hanging subject can be reduced because the radiation shield is excluded from the hanging subject. However, heat transfer occurs from the vacuum vessel 58 that is a room-temperature object to the first heat exchanger 80 that is a cryogenic body via the holding member 160 and, therefore, it is desired to provide one or more bent portions to prolong the distance from the outer end of the holding member 160 to the inner end, for reducing the amount of heat transferred to a minimum. In this case, since the gap in the vacuum vessel 58 spreads in an up-and-down direction, the bent-back portion is preferably so designed that this bent-back portion is stretched in the up-and-down direction according to the contour of the gap. In the bent-back portion, two stretching portions standing in a mutually opposing relationship to each other are preferably prevented from touching each other.

(4) NMR Spectrometer System and Cooling System

Figure 17:
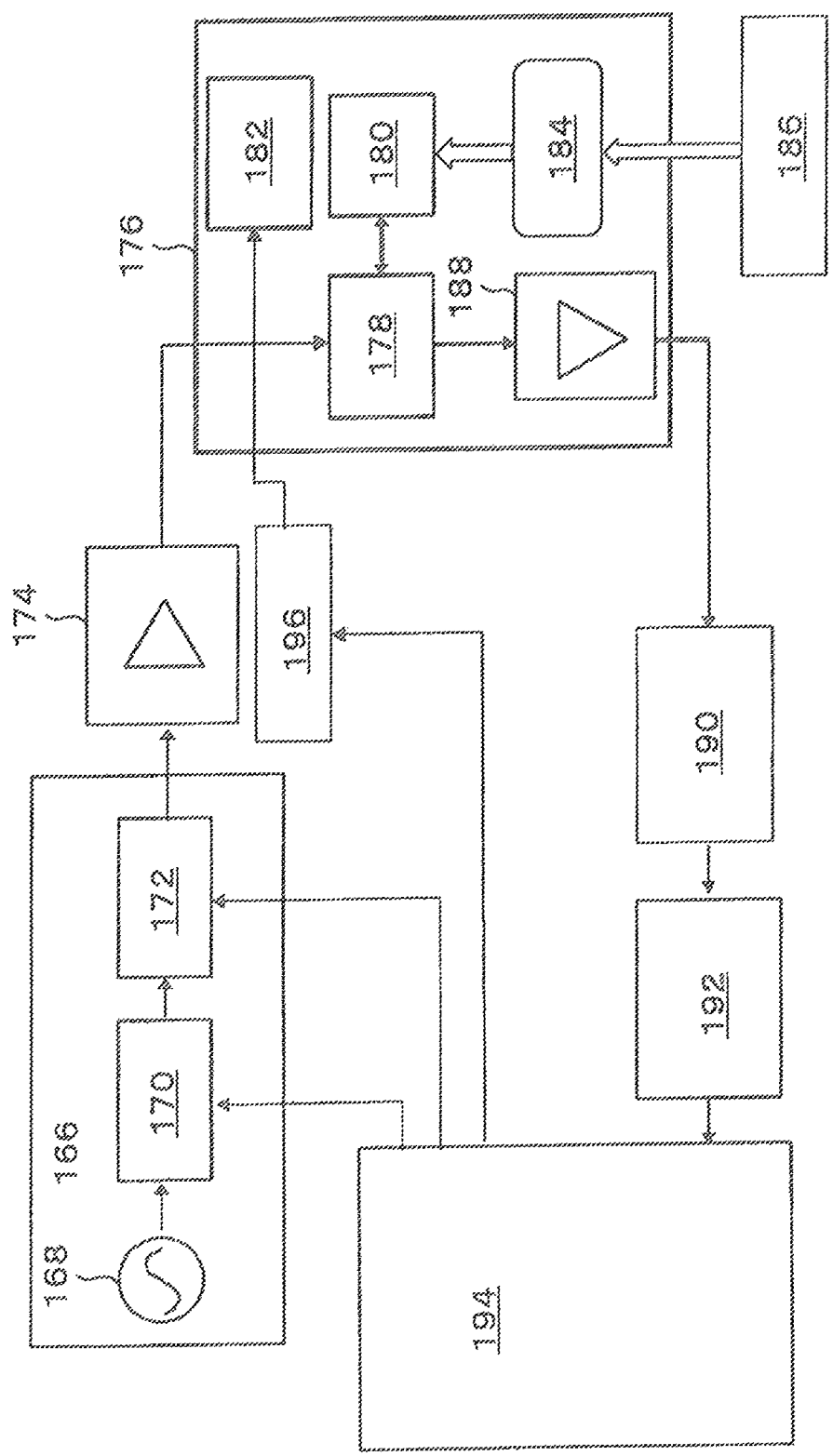
FIG. 17 is a block diagram of an NMR spectrometer system.

An example of configuration of an NMR spectrometer system is shown in FIG. 17. This system includes a signal generator 166 that has an oscillator 168 generating an RF signal. This RF signal is applied to a phase controller 170 and an amplitude controller 172 in turn so that the RF signal is controlled in phase and amplitude. The controlled RF signal is fed to a power amplifier 174, where the power of the RF signal is amplified to a power level necessary to excite an NMR signal. The amplified RF signal is fed to an NMR probe 176. In the NMR probe 176, the RF signal is supplied via a duplexer (switch for switching the signal between a transmit signal and a receive signal) 178 to a transmit/receive coil included in a core module 180. As a result, a varying magnetic field generated in the transmit/receive coil is applied to a sample under investigation. During a reception period subsequent to a given transmission period, a feeble NMR signal arising from the sample is detected by the transmit/receive coil. The detected NMR signal is fed via the duplexer 178 to a preamplifier 188, where the received signal is amplified. In a receiver 190, the received signal is detected or frequency-converted to convert the signal into a reception signal in an audio frequency band. At this time, the amplitude is adjusted. The converted reception signal is converted into a digital signal by an A/D converter 192 and sent to a control computer 194. The computer 194 has a function of controlling the phase controller 170 and the amplitude controller 172, a function of converting an NMR signal on a time axis into a spectral signal on a frequency axis (FFT), and a function of automatically correcting the phase of the converted spectral signal. A spectrum is displayed on the screen of a display device in response to a spectral signal that has been processed in a given manner.

An NMR probe has a sample spinning mechanism 182 whose operation is controlled by a sample spinning controller 196. The operation of this controller 196 is controlled by the computer 194. The NMR probe 176 incorporates various heat exchangers 184 to effectively cool a detection system inside the probe (especially, the core module 180). A refrigerant from a cooling system 186 is fed into the heat exchangers 184. A directional coupler for detecting reflected waves for tuning of the electronic circuit is omitted from being shown in FIG. 17. Preferably, the directional coupler is mounted in the NMR probe 176. Either a closed-cycle cooling system in which a refrigerant is reused during operation or an open-cycle cooling system in which a refrigerant is expelled to the outside during operation without being reused can be used as the cooling system 186. Both cooling systems are described below for reference.

Figure 18:
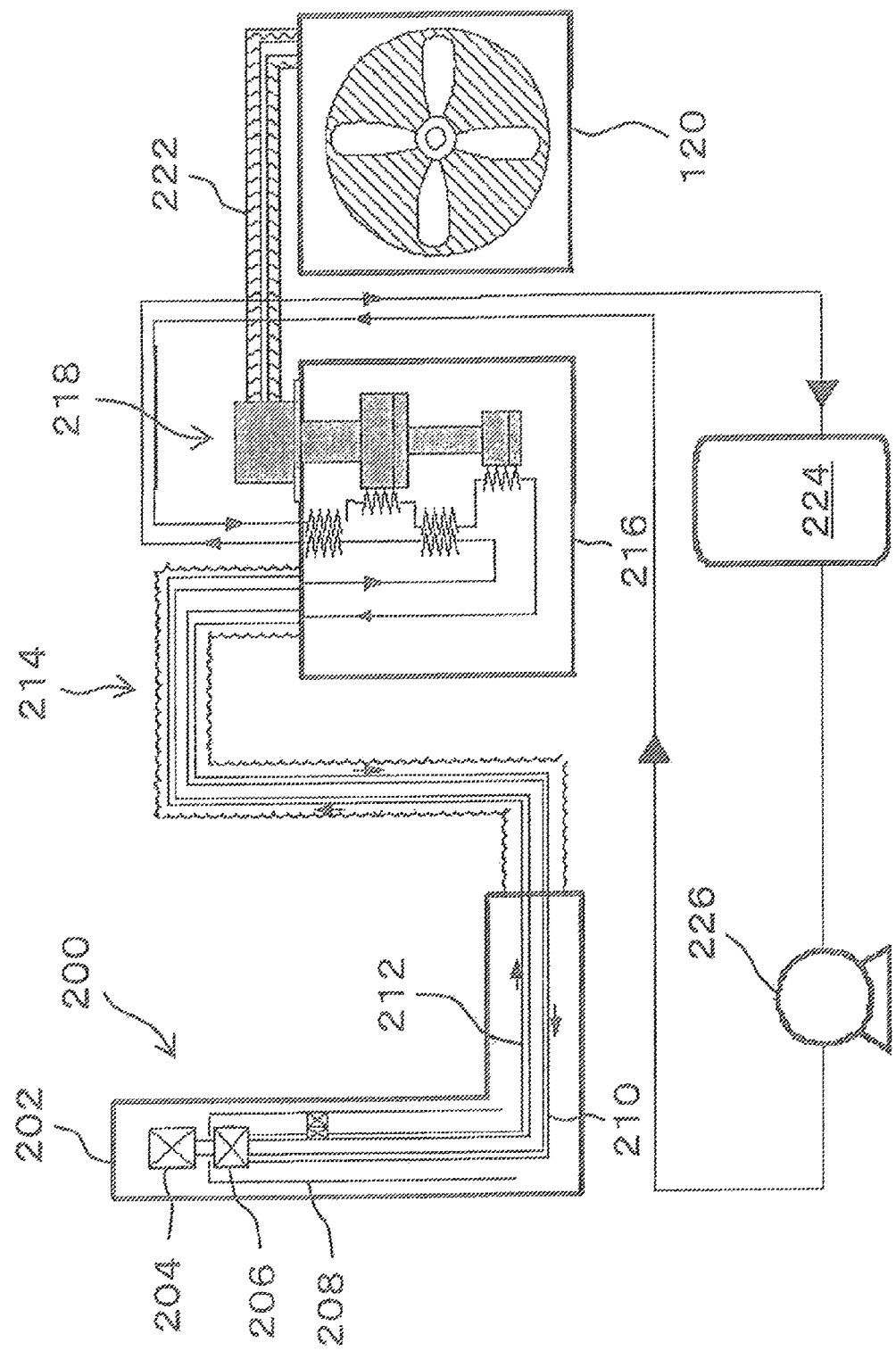
FIG. 18 schematically shows a cooling system of closed cycle.
Figure 19:
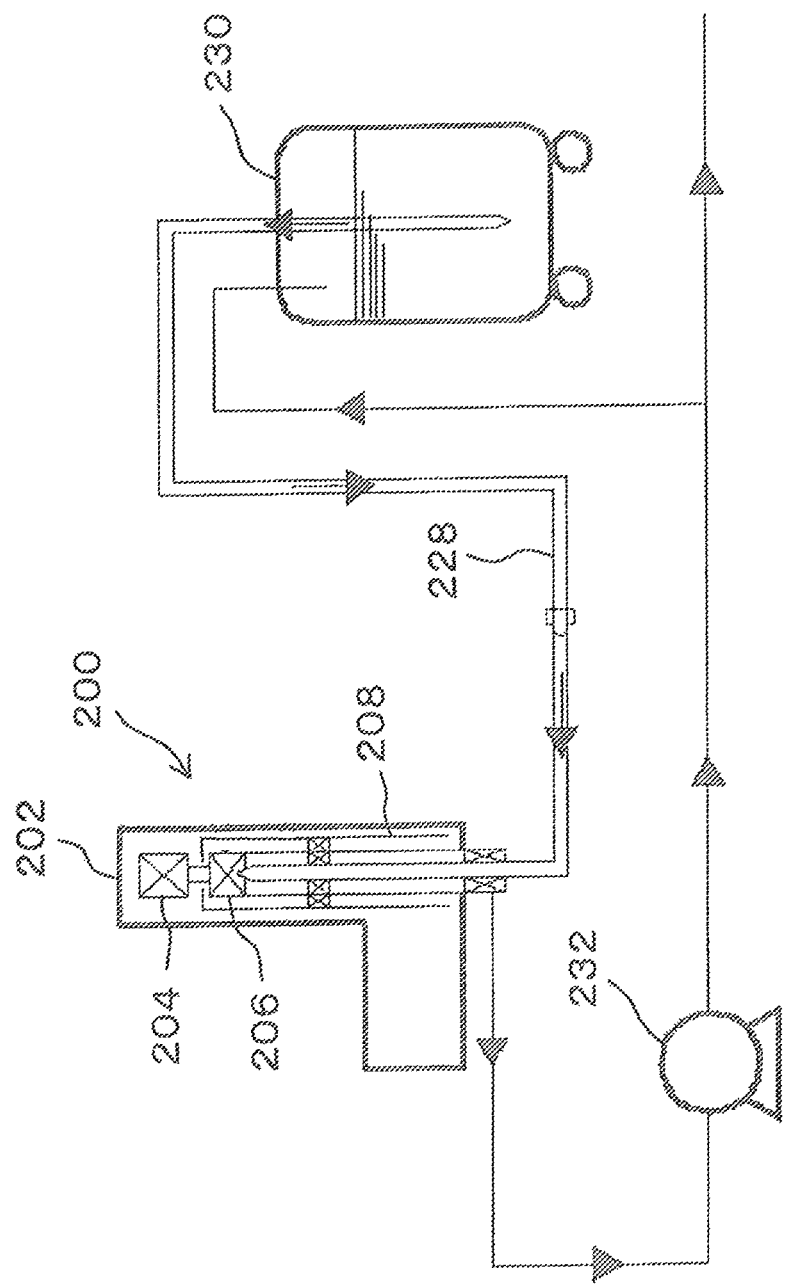
FIG. 19 schematically shows a cooling system of open cycle.
Figure 20:
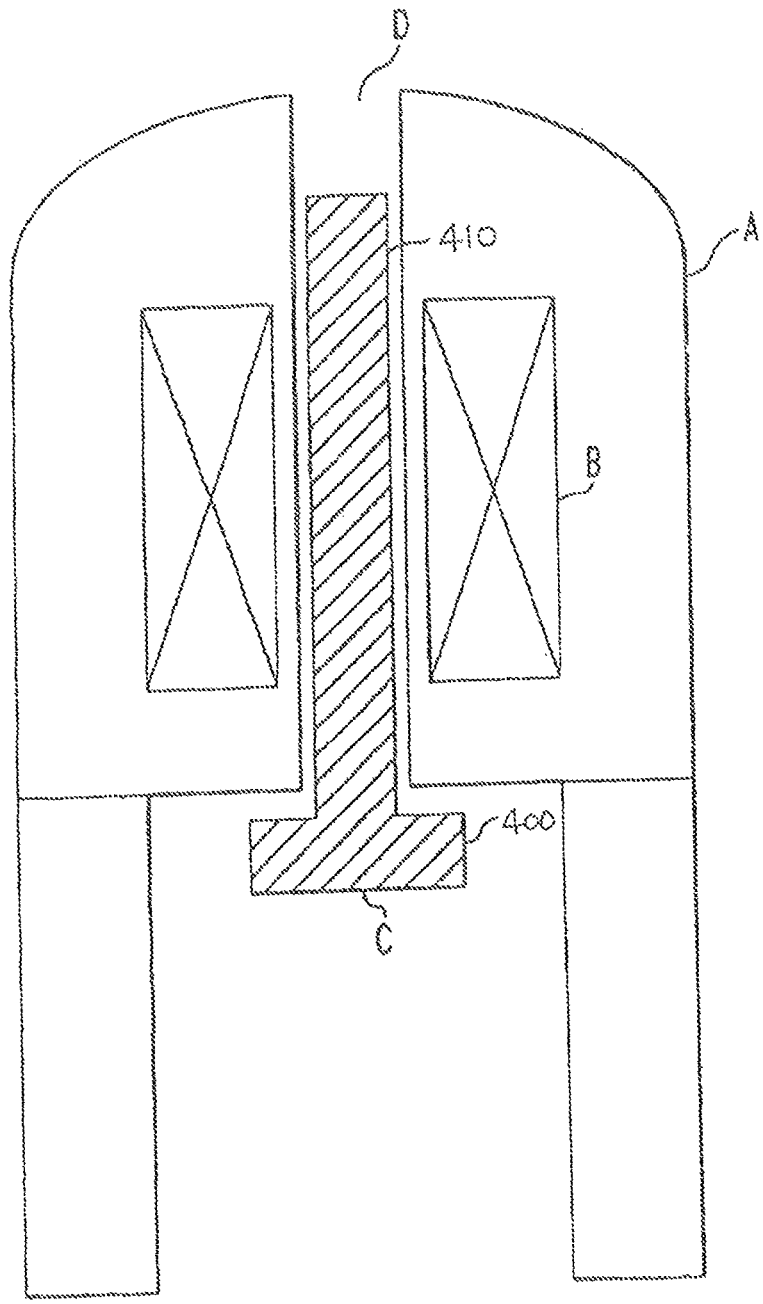
FIG. 20 is a schematic vertical cross section of a conventional NMR apparatus.
Figure 21:
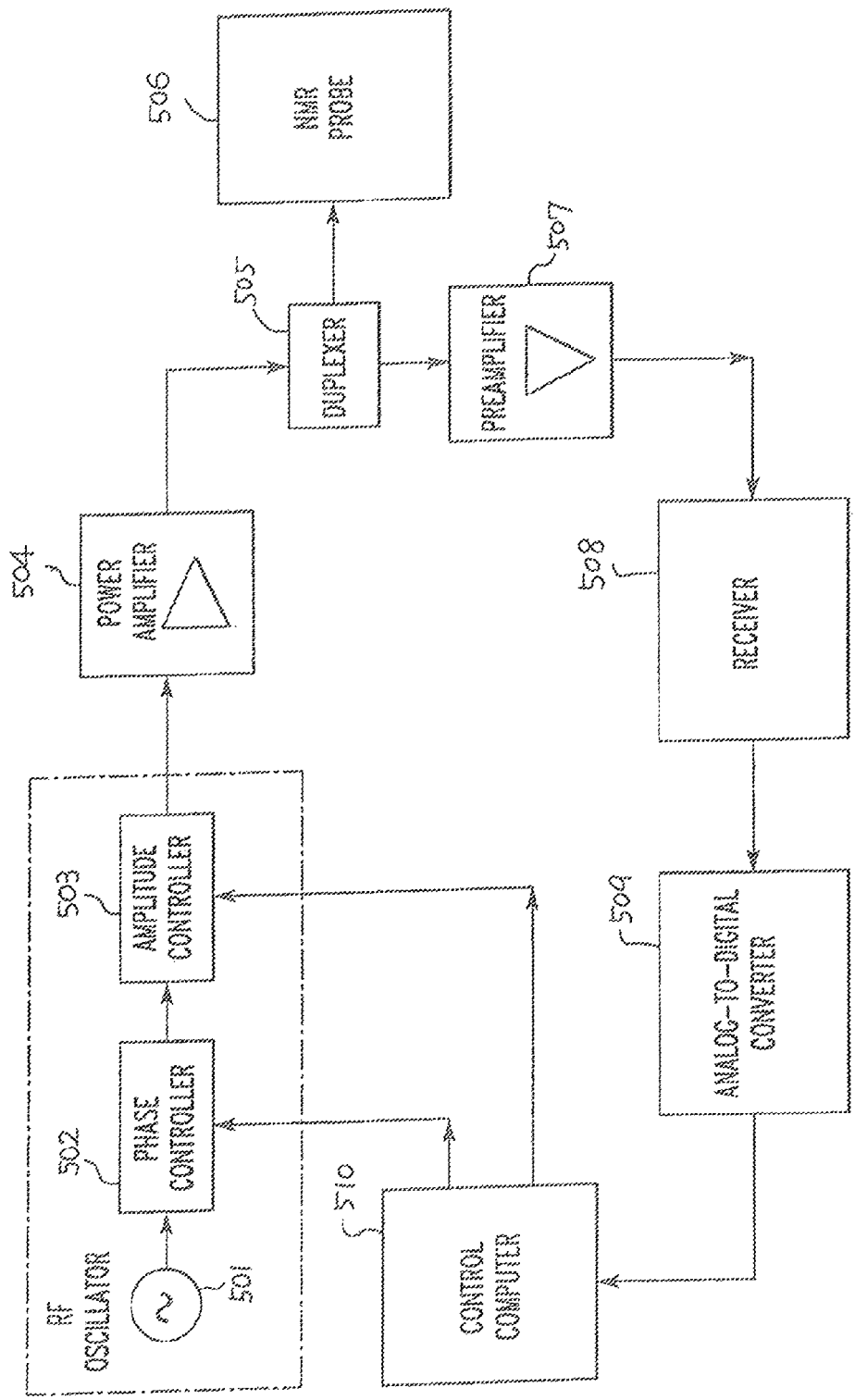
FIG. 21 is a block diagram of the conventional NMR apparatus.

A closed-cycle cooling system is shown in FIG. 18. This system includes an NMR probe 200 having a vacuum vessel 202. A core module 204, a heat exchanger 206, and a radiation shield 208 are mounted inside the vessel 202. An incoming refrigerant pipe 210 and an outgoing refrigerant pipe 212 are attached to the heat exchanger 206. The pipes are connected to a cold bench (heat exchanger) 216 via a bidirectional transfer tube 214. A refrigerating machine 218 is mounted in the cold bench 216. A compressor is connected with the refrigerating machine 218. Circulation of compressed helium gas is indicated by 222. Refrigerant expelled from the cold bench 216 is sent via a buffer tank 224 to an air supplying pump 226. Then, the refrigerant is fed back to the cold bench 216. In the open-cycle cooling system shown in FIG. 19, the NMR probe 200 is identical in structure with the already described NMR probe. Refrigerant expelled from a refrigerant tank 230 is sent to the heat exchanger 206 via a transfer tube 228 of a single port. Refrigerant emerging from the heat exchanger 206 is discharged as exhaust gas to the outside via an air supplying pump 232.

(5) Advantageous Effects of Embodiments

In the above embodiments, the transmit/receive coil is formed on the inner surface of the detection hole in the refrigerant block. Consequently, the following advantageous effects are obtained. The shape of the refrigerant block can be determined essentially irrespective of the shape of the transmit/receive coil. Hence, the refrigerant block can be fabricated as a large block. Therefore, the efficiency at which the transmit/receive coil is cooled can be improved by increasing the volumetric heat capacity of the refrigerant block. Temperature inhomogeneity can be eliminated. Furthermore, the transmit/receive coil is fabricated as a belt-like conductive layer and so the area of contact between the transmit/receive coil and the refrigerant block can be increased. This makes it possible to cool the transmit/receive coil efficiently. Especially, heat generated by the transmit/receive coil can be dissipated away or absorbed effectively. Therefore, if pulse irradiation is performed for a long time, the coil temperature can be maintained stably or the upper limit of the voltage of applied pulses can be increased. Furthermore, the refrigerant block can have a large cross-sectional area and be elongated along a straight line. Consequently, the amount of heat transferred can be increased easily. Additionally, it is not necessary to secure the core module in its installation location by jigs. In consequence, it is possible to avoid the problem that heat flows into the core module via jigs.

In the above embodiments, no bobbin is interposed between the transmit/receive coil and the sample and, therefore, the filling factor of the transmit/receive coil can be improved by reducing the distance between the coil and the sample. Furthermore, in the above embodiment, any basic body for forming the coil does not exist inside the transmit/receive coil. Hence, the coil's Q can be improved by enhancing the electrical performance of the inner surface of the transmit/receive coil. That is, the inner surface of the transmit/receive coil can be formed essentially as an exposed surface. A protective layer can be formed on this exposed surface. The most important portion can be maintained in an electrically good state. This yields the advantage that the characteristics of the transmit/receive coil can be improved.

In the above-described embodiments, the transmit/receive coil does not exist alone but formed on the inner surface of the detection hole in the refrigerant block and so the shape of the transmit/receive coil can be maintained stably. For example, in the case of a coreless coil such as a winding, there is the possibility that the shape is liable to change due to linear shrinkage during cooling. That is, the characteristics may vary. In contrast, in the above embodiment, the transmit/receive coil is formed on the refrigerant block and, therefore, the shape of the coil can be maintained stably.

As described so far, according to the present embodiment, during NMR measurement, a three to four times improvement in sensitivity (S/N) over the prior art can be achieved. As a result, the measurement time can be shortened. Also, more reliable measurement results can be obtained. As a result of enhanced measurement sensitivity, many nuclides which would have not been heretofore investigated easily from a practical point of view can be investigated.

Having thus described our invention with the detail and particularity required by the Patent Laws, what is desired protected by Letters Patent is set forth in the following claims.

The invention claimed is:

1. An NMR detection probe comprising:
a vacuum vessel inserted in a static magnetic field generator and extending along a central axis, the vacuum vessel having a bottom at a bottom height;
an internal structure mounted in the vacuum vessel and having a detection coil for detecting an NMR signal emanating from a sample and a cooling source for cooling the coil; and
a holding member for holding the internal structure to the vacuum vessel above the bottom height of the vacuum vessel as viewed along the central axis, said holding member having an elongated portion extending along the central axis between the vacuum vessel and the internal structure.

2. The NMR detection probe as set forth in claim 1, wherein said holding member includes an outer end portion secured to said vacuum vessel, an inner end portion supporting said internal structure, and an intermediate portion located between the outer end portion and the inner end portion and including said elongated portion.

3. The NMR detection probe as set forth in claim 2, wherein said elongated portion is made up of a plurality of links spaced from each other.

4. The NMR detection probe as set forth in claim 2, wherein said internal structure has a radiation shield that extends along an inner surface of said vacuum vessel in an up-and-down direction and blocking infrared radiation, and wherein said inner end portion holds the radiation shield, which in turn supports said cooling source.

5. The NMR detection probe as set forth in claim 4, wherein a connecting member made of a heat insulating material is mounted at an intermediate position of said radiation shield that is lower than a position at which said inner end portion is held, and wherein said cooling source is supported by said radiation shield via the connecting member.

6. The NMR detection probe as set forth in claim 1, wherein said internal structure depends from and is secured to an upper portion of said vacuum vessel via said holding member.

7. The NMR detection probe as set forth in claim 1, further comprising restriction means for restricting horizontal motion of a lower portion of said internal structure.

8. The NMR detection probe as set forth in claim 7, wherein said restriction means includes a first member extending downward from said cooling source and a second member engaging with the first member and restricting horizontal motion of the first member while permitting sliding motion of the first member along the central axis.

9. The NMR detection probe as set forth in claim 1, wherein a detection module having said detection coil is held to said cooling source via a hard heat conductor, and wherein the detection module is isolated from said vacuum vessel via a vacuum insulating layer.

\* \* \* \* \*